(12) United States Patent
Tezuka et al.

(10) Patent No.: US 7,299,104 B2
(45) Date of Patent: Nov. 20, 2007

(54) SUBSTRATE PROCESSING APPARATUS AND SUBSTRATE TRANSFERRING METHOD

(75) Inventors: Kazuyuki Tezuka, Nirasaki (JP); Hiroshi Koizumi, Nirasaki (JP); Tsuyoshi Moriya, Nirasaki (JP); Hiroyuki Nakayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 359 days.

(21) Appl. No.: 10/858,049

(22) Filed: Jun. 2, 2004

(65) Prior Publication Data
US 2004/0240971 A1    Dec. 2, 2004

(30) Foreign Application Priority Data
Jun. 2, 2003  (JP) .............................. 2003-156821
Apr. 9, 2004  (JP) .............................. 2004-115741

(51) Int. Cl.
*G06F 19/00* (2006.01)
*G06F 7/66* (2006.01)

(52) U.S. Cl. .................. 700/112; 700/113; 700/121; 700/123; 118/712; 118/715; 118/725; 118/500; 118/728; 118/729; 204/298.25; 438/680

(58) Field of Classification Search ................ 700/112, 700/113, 121, 123; 118/725, 500, 712, 715, 118/728, 729; 204/298.29; 438/680
See application file for complete search history.

(56) References Cited

U.S. PATENT DOCUMENTS

| 4,657,621 | A | * | 4/1987 | Johnson et al. | ......... 156/345.31 |
| 5,943,230 | A | * | 8/1999 | Rinnen et al. | ................ 700/18 |
| 6,132,553 | A | * | 10/2000 | Ikeda et al. | .............. 156/345.1 |
| 6,328,864 | B1 | * | 12/2001 | Ishizawa et al. | ....... 204/298.01 |
| 6,773,762 | B1 | * | 8/2004 | Fukiage | ...................... 427/534 |
| 7,047,903 | B2 | * | 5/2006 | Ito | .......................... 118/723 I |
| 2001/0010204 | A1 | * | 8/2001 | Takeyama et al. | ............ 118/50 |

* cited by examiner

*Primary Examiner*—Michael D. Masinick
(74) *Attorney, Agent, or Firm*—Oblon, Spivak, McClelland, Maier & Neustadt, P.C.

(57) ABSTRACT

Shock waves occurring when opening a gate valve between two vacuum chambers and peeling of particles by a viscous force taking place when a gas is supplied into a vacuum chamber are necessary to be suppressed by the apparatus and method of the invention, whereby contamination of a substrate by particles is suppressed. If one vacuum chamber is a substrate processing chamber for performing a vacuum process on the substrate and the other chamber is a transfer chamber having a substrate transfer device therein, the gate valve is opened when inner pressures of both the vacuum chambers are less than 66.5 Pa and higher one thereof is less than twice a lower one thereof. Preferably, a purge gas for peeling of particles is supplied, before supplying the purge gas for pressure control, into the substrate processing chamber with a flow rate greater than that of the purge gas for pressure control.

10 Claims, 20 Drawing Sheets

| N2 GAS FLOW RATE [sccm] | OCCURRENCE OF PARTICLE SCATTERING |
|---|---|
| 100 | NOT OCCURRING |
| 200 | NOT OCCURRING |
| 300 | NOT OCCURRING |
| 400 | OCCURRING |
| 500 | OCCURRING |
| 400 | NOT OCCURRING |
| 500 | OCCURRING |
| 600 | OCCURRING |
| 800 | OCCURRING |
| 700 | NOT OCCURRING |

SUBSTRATE PROCESSING APPARATUS AND SUBSTRATE TRANSFERRING METHOD

FIELD OF THE INVENTION

The present invention relates to a substrate processing apparatus in which a plurality of substrate processing chambers are airtightly coupled to a transfer chamber having a substrate transfer device for transferring a substrate, e.g., semiconductor wafer (hereinafter, referred to as 'wafer'), and a method for transferring a substrate thereto; and, more particularly, to a technology for transferring a substrate between two vacuum chambers in a substrate processing apparatus having a first and a second vacuum chamber coupled to each other through a sluice valve and performing a vacuum process on the substrate.

BACKGROUND OF THE INVENTION

In a semiconductor fabrication apparatus, there is a known mechanism such that a plurality of processing chambers is coupled to a transfer chamber having a substrate transfer device, i.e., cluster tools or multi-chamber mechanism. Such a mechanism has some merits that a vacuum processing on a substrate can be performed continuously without breaking a vacuum state in case of performing same several times, for example, and a processing chamber can be kept away from the atmosphere. Further, high throughput can be obtained.

In the cluster tools mentioned above, one side of a polygonal transfer chamber is airtightly coupled to a load-lock chamber, and, at the same time, other sides are airtightly coupled to a plurality of processing chambers. In addition, a substrate transfer device installed inside the transfer chamber has two forks for supporting a semiconductor wafer (hereinafter, referred to as 'wafer'). Here, the forks can be revolved, extended, and shrunken by operations of a robot.

While, in the cluster tools, one fork of the substrate transfer device reaches to a load-lock chamber to pick up an unprocessed wafer to mounts same thereon, the other fork reaches to load a processed wafer thereon. Thereafter, the unprocessed wafer on the one fork is transferred to the processing chamber by revolving the robot by 180°.

However, if the robot is rotated by 180° whenever a wafer is loaded in one processing chamber, it takes a relatively long time to transfer the wafer. As a result, throughput becomes lowered. For insuring high throughput by effectively using the cluster tools, it is important to transfer the substrate efficiently. As an apparatus for efficiently transferring a substrate, there has been disclosed an apparatus in Japanese Patent Laid-open Publication Heisei No. 11-207666.

In a cluster tools described in the aforementioned prior art, as shown in FIG. 21, five processing chamber stations (hereinafter, referred to as 'processing chamber') 91 to 95 are airtightly coupled to a transfer chamber 90, and a handling robot 96 for transferring a wafer of a substrate to the transfer chamber 90 is disposed. The handling robot 96 has two transfer tables 97a and 97b for supporting the wafer. The transfer tables 97a and 97b are constructed so as to appear and disappear in the same direction as a revolving direction or in a direction shifted a small angle, by robot link mechanisms 98a and 98b which can conduct extending and shrinking operations, and revolve. Thereby, the transfer tables 97a and 97bneed not to revolve to reach a next processing chamber but revolve by a few angles such that a processed wafer can be exchanged with an unprocessed wafer in the same corresponding processing chamber.

FIGS. 17 to 20 of the aforementioned prior art show operation states of the conventional handling robot mentioned above. In this example, it is described that each of the two robot link mechanisms 98a and 98b stands by in the transfer chamber 90 while supporting an unprocessed wafer. At first, a wafer of a first robot link mechanism 98a is loaded into a processing chamber 93, and subsequently, a wafer of a second robot link mechanism 98b is loaded into the processing chamber 94 adjacent to the processing chamber 93.

However, when comparing the time required for performing a process in each processing chamber of the cluster tools with that for transferring an unprocessed wafer from a load-lock chamber to the processing chamber, there are cases that the processing time is shorter than the transfer time and vice versa. Here, in case where the processing time is longer than the transfer time, as described in the prior art, the unprocessed wafer is held by the substrate transfer device in the transfer chamber until performing a process on a prior wafer is completed in the processing chamber. Upon completing the process in the corresponding processing chamber, the processed wafer will be immediately unloaded. Since the processed wafer and an unprocessed wafer can be quickly exchanged in the corresponding process chamber, it is possible to reduce the transfer time and transfer effectively.

However, in case where the processing time is shorter than the transfer time, the processing on the wafer must already have been completed in the processing chamber while the unprocessed wafer being transferred from the load-lock chamber by the substrate transfer device. Thus, the configuration of the aforementioned prior art does not help to facilitate the transfer of the wafer effectively since there is no case where the unprocessed wafer stands by until performing a process on a prior wafer is completed in the processing chamber, in such a state where a wafer is supported by the substrate transfer device in the transfer chamber.

Further, there are the following problems in an apparatus for performing a vacuum process of a cluster tools or the like. For example, when supporting or repairing the apparatus, an interior of the processing chamber is opened to the atmosphere by opening a lid of the processing chamber. At this time, particles from the outside are introduced into the processing chamber to thereby be attached thereto. In addition, reaction products are attached to the processing chamber on performing a vacuum process, e.g., etching. Meanwhile, when loading a wafer from the load-lock chamber into the processing chamber, a gate valve of a sluice valve is opened. At this time, if there is a pressure difference between the processing chamber and the load-lock chamber, shock waves are generated to thereby peel off the particles attached to the chamber. As a result, there is a concern for contaminating the wafer.

Meanwhile, there has been known a technology for suppressing a rapid flow of a gas and preventing an oscillation by setting up the pressures of two chambers at the vicinity of the atmosphere so as to minimize the pressure difference before opening the gate valve between the processing chamber and the load-lock chamber or the processing chambers adjacent to each other, and making the pressures equal by opening a connecting line valve (Japanese Patent Laid-open Publication Heisei No. 6-177060).

However, the aforementioned method is not effective since shock waves are generated when opening the valve in the case of employing a connecting line between the vacuum chambers. Further, even if the pressure difference becomes small, the shock wave strong enough to peel off the particles inside the chamber may be generated depending on a pressure band. Since a design rule of a semiconductor device is getting more and more strict, it is required that the substrate should be managed more carefully to prevent the contamination of the wafer due to the particles. However, it is difficult to respond to such needs with the conventional technology.

SUMMARY OF THE INVENTION

The present invention is contrived on the basis of such a situation. It is, therefore, a primary object of the present invention to provide a substrate processing apparatus capable of transferring a substrate with high transfer efficiency, even in case where a processing time is shorter than a transfer time.

Another object of the present invention is to provide a substrate processing apparatus capable of transferring the substrate with high transfer efficiency, regardless whether the processing time is shorter or longer than the transfer time.

Still another object of the present invention is to provide a substrate processing apparatus and a substrate transferring method capable of suppressing the generation of shock waves when opening a sluice valve between vacuum chambers, and, at the same time, suppressing particles being peeled off by viscous force when a gas is supplied into a vacuum chamber, whereby contamination of the substrate due to the particles can be suppressed.

In accordance with one aspect of the invention, there is provided a substrate processing apparatus, including: a substrate transfer device having, a first and a second revolving unit for revolving around a common revolution center, a first and a second substrate supporting unit, capable of advancing and retracting, installed to the first and the second revolving unit, respectively, and disposed in a same plane, a first and a second advancement/retraction driving unit for advancing, and retracting the first and the second supporting unit, respectively, and a first and a second revolution driving unit for driving the first and the second revolving unit; a transfer chamber in which the substrate transfer device is installed; one or more substrate processing chambers disposed around the transfer chamber along a circle whose center substantially coincides with the revolution center and being in contact with the transfer chamber, loading and unloading of substrates into and from the substrate processing chambers being performed by the substrate transfer device; one or more loading/unloading chambers disposed around the transfer chamber along a circle whose center substantially coincides with the revolution center and being in contact with the transfer chamber, loading and unloading of the substrates into and from the loading/unloading chambers being performed by the substrate transfer device; and a control unit for controlling the first and the second advancement/retraction driving unit and the first and the second revolution driving unit, wherein in the case where a substrate transfer time in the transfer chamber is longer than a substrate processing time in a substrate processing chamber, the first and the second substrate supporting unit substantially simultaneously receive a processed substrate in the substrate processing chamber and an unprocessed substrate in a loading/unloading chamber respectively, and then, substantially simultaneously deliver the processed substrate and the unprocessed substrate to one of the loading/unloading chambers and the substrate processing chamber, respectively.

In accordance with another aspect of the invention, there is provided a substrate processing apparatus, including: a substrate transfer device having, a first and a second revolving unit for revolving around a common revolution center, a first and a second substrate supporting unit, capable of advancing and retracting, installed to the first and the second revolving unit, respectively, and disposed in a same plane, a first and a second advancement/retraction driving units for advancing and retracting the first and the second supporting unit, respectively, and a first and a second revolution driving unit for driving the first and the second revolving unit; a transfer chamber in which the substrate transfer device is installed; a plurality of substrate processing chambers disposed around the transfer chamber along a circle whose center substantially coincides with the revolution center and being in contact with the transfer chamber, loading and unloading of the substrate into and from the substrate processing chambers being performed by the substrate transfer device; one or more loading/unloading chambers disposed around the transfer chamber along a circle whose center substantially coincides with the revolution center and being in contact with the transfer chamber, loading and unloading of the substrate into and from the loading/unloading chambers being performed by the substrate transfer device; and a control unit for controlling the first and the second advancement/retraction driving unit and the first and the second revolution driving unit such that the substrate transfer device is operated in a first or a second transfer mode, wherein the first transfer mode is selected if a substrate transfer time in the transfer chamber is longer than a substrate processing time in a substrate processing chamber, and the second transfer mode is selected if the substrate transfer time in the transfer chamber is shorter than the substrate processing time in the substrate processing chamber, the first and the second revolution driving unit and the first and the second advancement/retraction driving unit are controlled in a selected transfer mode.

In accordance with still another aspect of the invention, there is provided a substrate transferring method for use in a substrate processing apparatus including: a first and a second revolving unit for revolving around a common revolution center, a first and a second substrate supporting unit, capable of advancing and retracting, installed to the first and the second revolving unit, respectively, and disposed in a same plane, a first and a second advancement/retraction driving unit for advancing and retracting the first and the second supporting unit, respectively, a substrate transfer device having a first and a second revolution driving unit for driving the first and the second revolving unit, a transfer chamber in which the substrate transfer device is installed, one or more substrate processing chambers disposed around the transfer chamber along a circle whose center substantially coincides with the revolution center and being in contact with the transfer chamber, loading and unloading of the substrate into and from the substrate processing chambers being performed by the substrate transfer device, and one or more loading/unloading chambers disposed around the transfer chamber along a circle whose center substantially coincides with the revolution center and being in contact with the transfer chamber, loading and unloading of the substrate into and from the loading/unloading chambers being performed by the substrate transfer device, the method including the steps of: in case where a substrate transfer time in the transfer chamber is longer than a substrate processing time in a substrate processing chamber, substantially simultaneously receiving a processed substrate in the substrate processing chamber and an unprocessed substrate of a loading/unloading chamber by the first and the second substrate supporting unit, respectively; and then substantially simultaneously delivering the processed substrate and the unprocessed substrate to one of the loading/unloading chambers and the substrate processing chamber by the first and the second substrate supporting unit, respectively.

In accordance with still another aspect of the invention, there is provided a substrate transferring method for use in a substrate processing apparatus having: a first and a second revolving unit for revolving around a common revolution center, a first and a second substrate supporting unit, capable of advancing and retracting, installed to the first and the second revolving unit, respectively, and disposed in a same plane, a first and a second advancement/retraction driving unit for advancing and retracting the first and the second supporting unit, respectively, a substrate transfer device having a first and a second revolution driving unit for driving the first and the second revolving unit, a transfer chamber in which the substrate transfer device is installed, a plurality of substrate processing chambers disposed around the transfer chamber along a circle whose center substantially coincides with the revolution center and being contact with the transfer chamber, loading and unloading of the substrate into and from the substrate processing chambers being performed by the substrate transfer device, one or more loading/unloading chambers disposed around the transfer chamber along a circle whose center substantially coincides with the revolution center and being in contact with the transfer chamber, loading and unloading of the substrate into and from the loading/unloading chambers being performed by the substrate transfer device, the method including the steps of: transferring in the transfer chamber a substrate to a substrate processing chamber in a first transfer mode and performing a first process on the substrate in the substrate processing chamber; and subsequently transferring in the transfer chamber a substrate to the substrate processing chamber in a second transfer mode and then performing a second process on the substrate in the substrate processing chamber.

In accordance with still another aspect of the invention, there is provided a substrate processing apparatus, wherein a first vacuum chamber is connected to a second vacuum chamber through a transferring port, which is opened and closed by a sluice valve, and a wafer is transferred between the first and the second vacuum chamber by a substrate transfer device through the transferring port, and a vacuum process is performed on substrates, the apparatus including: a first pressure detection unit for detecting an inner pressure of the first vacuum chamber; a second pressure detection unit for detecting an inner pressure of the second vacuum chamber; a purge gas supply unit for pressure control, which supplies a purge gas for pressure control into one of the first and the second vacuum chamber; and a control unit for outputting a control signal to open the sluice valve under a condition that both pressure detection values of the first and the second pressure detection unit are less than 66.5 Pa and a higher one of the pressure detection values is less than twice a lower one of the pressure detection values. Meanwhile, a vacuum processing on a substrate is not limited to a case of employing a process gas, but it may be, e.g., ion implantation process. Herein, the term 'the purge gas supply unit for pressure control, which supplies the purge gas for pressure control to one of the first and the second vacuum chamber' means that a purge gas supply unit for supplying a purge gas into corresponding vacuum chamber is required so as to make small the pressure difference by increasing the inner pressure of the vacuum chamber having a lower pressure, but it is not intended to exclude a case where a purge gas supply unit for supplying a purge gas into another vacuum chamber is installed.

In accordance with still another aspect of the invention, there is provided a substrate processing apparatus, wherein a first vacuum chamber is connected to a second vacuum chamber through a transferring port, which is opened and closed by a sluice valve, and a wafer is transferred between the first and the second vacuum chamber by a substrate transfer device through the transferring port, and a vacuum process is performed on substrates, the apparatus including: a first pressure detection unit for detecting an inner pressure of the first vacuum chamber; a second pressure detection unit for detecting an inner pressure of the second vacuum chamber; and a control unit for outputting a control signal to open the sluice valve under a condition that both pressure detection values of the first and the second pressure detection unit are less than 13.3 Pa.

In accordance with still another aspect of the invention, there is provided a substrate transferring method for use in a substrate processing apparatus wherein a substrate is transferred between a first and a second vacuum chamber by a substrate transfer device through a transferring port, the second vacuum chamber being connected to the first vacuum chamber through the transferring port which is opened and closed by a sluice valve, the method including the steps of: supplying a purge gas for pressure control to one of the first and the second vacuum chamber; and then opening the sluice valve under a condition that both pressure detection values of the first and the second vacuum chamber are less than 66.5 Pa and a higher one of the pressure detection values is less than twice a lower one of the pressure detection values.

In accordance with still another aspect of the invention, there is provided a substrate transferring method for use in a substrate processing apparatus wherein a substrate is transferred between a first and a second vacuum chamber by a substrate transfer device through a transferring port, the second vacuum chamber being connected to the first vacuum chamber through the transferring port which is opened and closed by a sluice valve, wherein the sluice valve is opened under a condition that both pressure detection values of the first and second vacuum chamber are less than 13.3 Pa.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENTS

Figure 1:
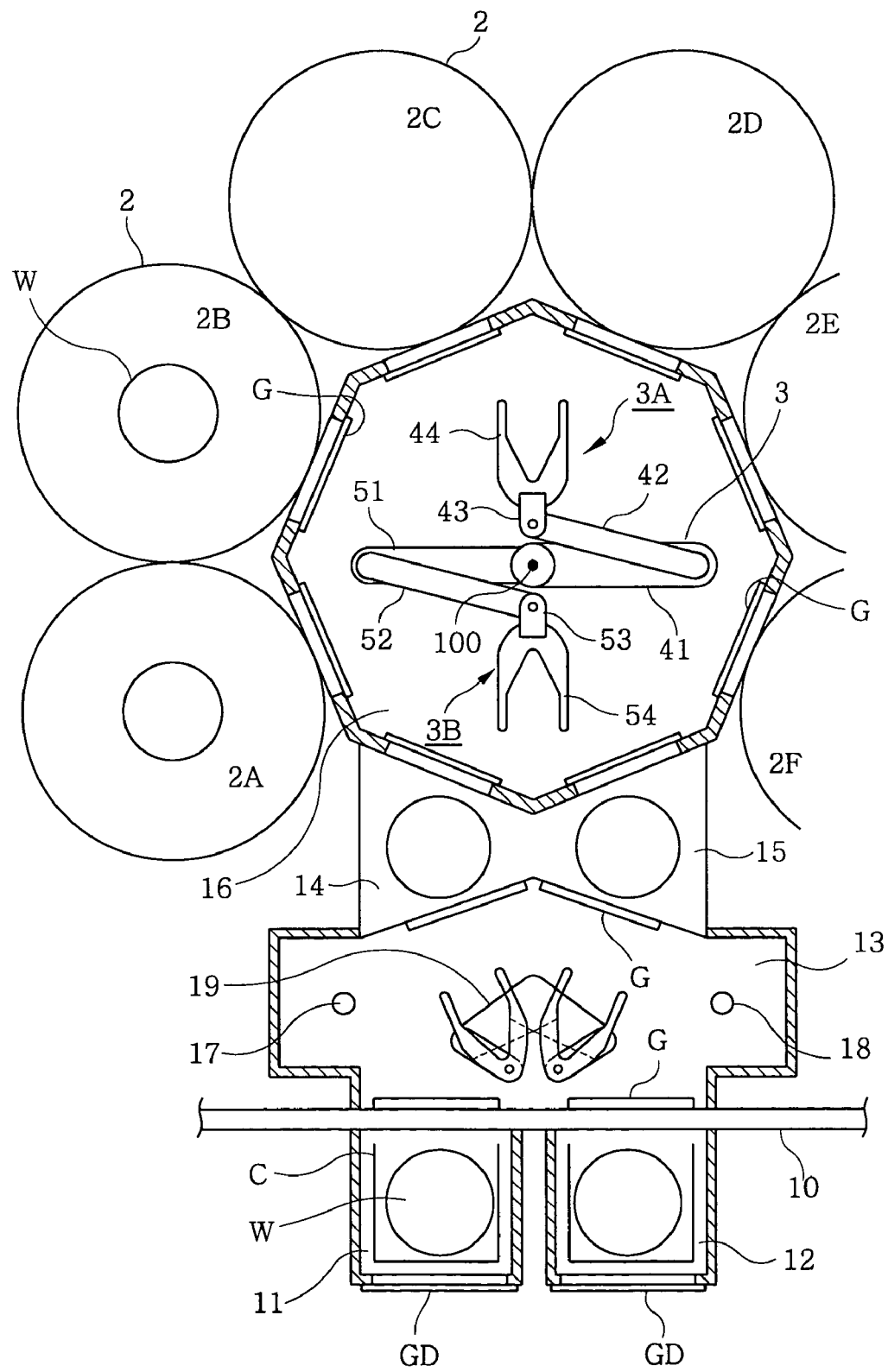
FIG. 1 offers an entire plain view showing a preferred embodiment of a substrate processing apparatus in accordance with the present invention.
Figure 2:
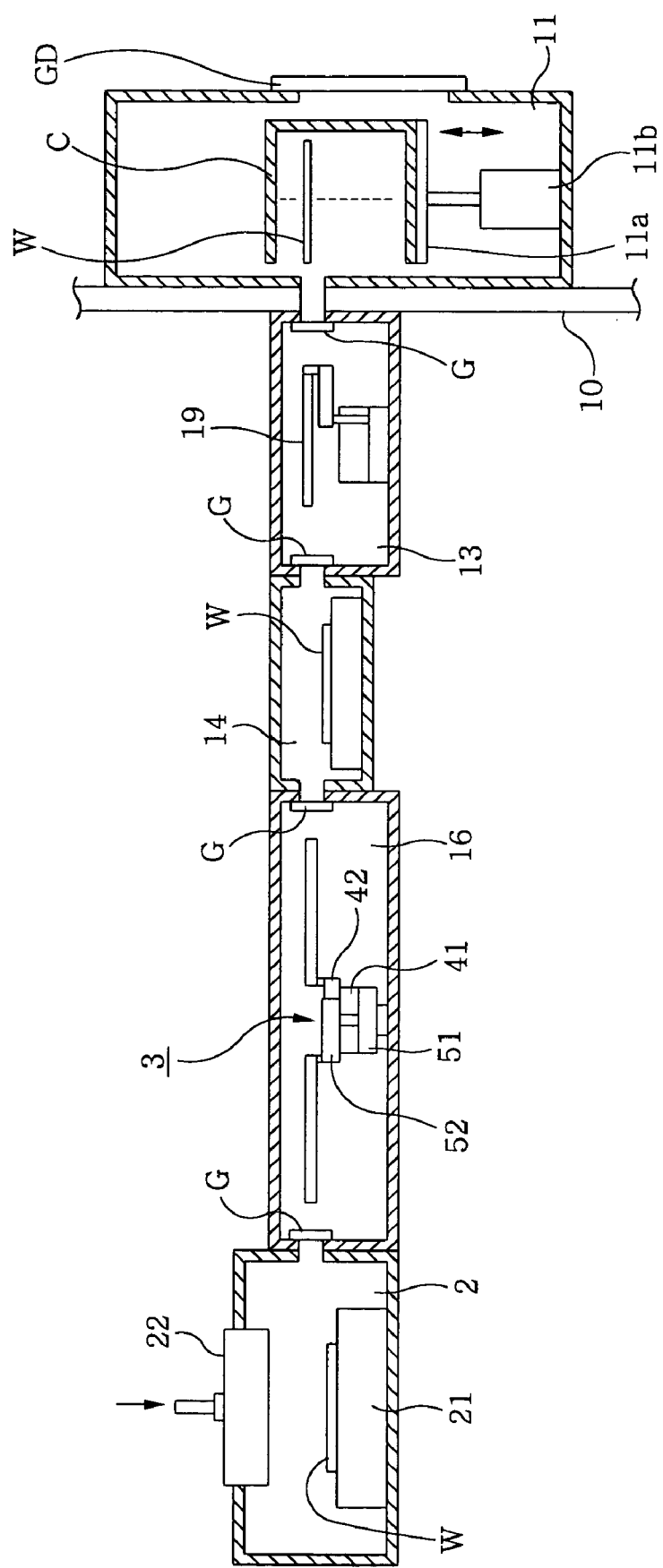
FIG. 2 schematically shows a vertical sectional view of the substrate processing apparatus.

FIGS. 1 and 2 are views for showing a preferred embodiment of a substrate processing apparatus in accordance with the present invention. The substrate processing apparatus includes, e.g., two cassette chambers 11 and 12 each having an airtight structure, in which a cassette (transfer container) C accommodating a plurality of wafers, i.e., substrates, is loaded. Each gate door GD is prepared at the atmosphere side of each of the cassette chambers 11 and 12 to thereby airtightly shut off the corresponding cassette chamber from the atmosphere. As shown in FIG. 2, an elevator 11b is installed in each of the cassette chambers 11 and 12 so as to elevate a cassette mounting table 11a and dispose a wafer supporting groove in the cassette C at an excess level of a first transfer device that will be discussed later, subsequently.

Inner sides of the cassette chambers 11 and 12 are airtightly connected to a first transfer chamber 13 having an airtight structure. And, the first transfer chamber 13 is airtightly connected to a second transfer chamber 16 of a vacuum state via preliminary vacuum chambers 14 and 15 of two load-lock chambers (waiting rooms) standing side by side. Here, the preliminary vacuum chambers 14 and 15 correspond to loading/unloading chambers of the present invention. In addition, reference number 10 in the drawing indicates a panel forming a bulkhead. In the first transfer chamber 13, there are installed position aligning stages 17 and 18 for aligning a direction of a wafer W while it being rotated, and a first substrate transfer device 19 for transferring the wafer W between the cassette chambers 11 and 12 and the preliminary vacuum chambers 14 and 15 and the position aligning stages 17 and 18. The cassette chambers 11 and 12 and the first transfer chamber 13 are, e.g., in an inert gas atmosphere, but may be in a vacuum state.

A second transfer chamber 16 is formed of a polygonal shape, e.g., octagonal shape, and has a second substrate transfer device 3 therein. In the second transfer chamber 16, six sides in eight sides of the octagonal shape are airtightly connected to substrate processing chambers, e.g., vacuum chambers 2A to 2F, and the rest two sides are connected to the preliminary vacuum chambers 14 and 15. For the convenience of illustration, a vacuum chamber 2 in FIG. 1 is shown as a simple circle. But, in a case of using the circle chamber practically, a member for forming a transferring port, which connects the chamber 2 to the second transfer chamber 16, is intervened. Reference number G in the drawing indicates a gate valve of a sluice valve for opening and closing the transferring port.

Further, the vacuum chamber 2 may be a chamber of, e.g., rectangular shape. As for a vacuum process performed in the vacuum chamber 2, there are processes of etching by an etching gas, forming a film by a film forming gas, ashing by an ashing gas, and the like. As shown in FIG. 2, in the vacuum chamber 2, there are installed a mounting table 21 for mounting a wafer W thereon, a gas supply unit 22 for supplying a process gas, and the like. And, a central portion of the wafer W to be mounted on the mounting table 21 in each vacuum chamber 2 is placed on a circle whose a center is equal to that of the second transfer chamber 16.

Figure 3:
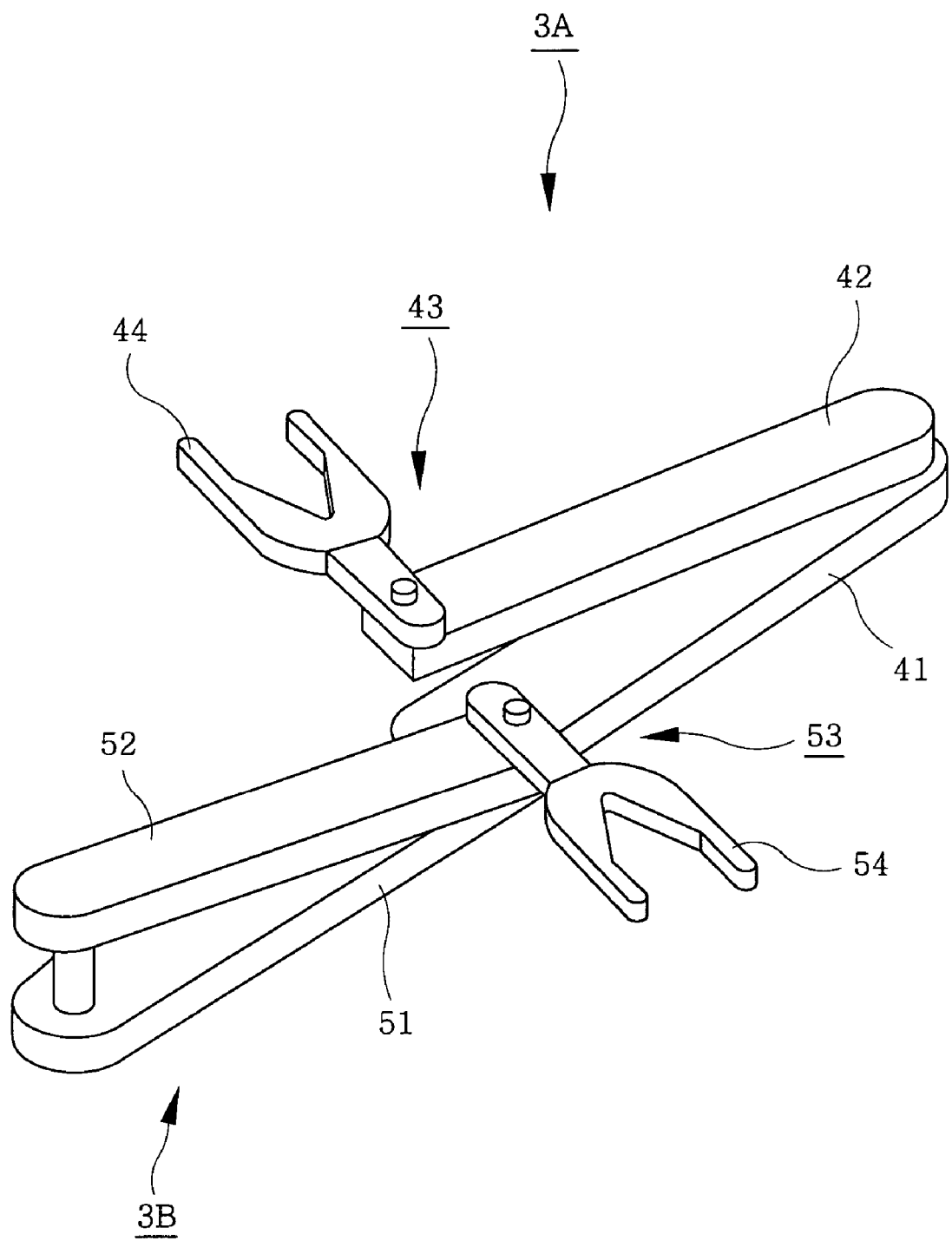
FIG. 3 sets forth a schematic diagram showing a preferred embodiment of a substrate transfer device in accordance with the present invention.

Next, the second substrate transfer device 3 of a substrate transfer device in accordance with the present invention will be explained. FIG. 3 shows a schematic configuration of the second substrate transfer device and FIG. 4 describes a transfer mechanism thereof. In this example, the substrate transfer device 3 includes a first multi-joint arm 3A forming a first transfer part and a second multi-joint arm 3B forming a second transfer part. The first multi-joint arm 3A has a revolving arm 41 forming a first revolving part where a revolution center 100 corresponds to the center of the second transfer chamber 16, a middle arm 42 installed at a rear end of the revolving arm 41 to make it rotate horizontally, and a first substrate supporting unit 43 installed at a rear end of the middle arm 42 such that it allows to rotate horizontally. The middle arm 42 is set to have a substantially same length as that of the revolving arm 41.

In the second multi-joint arm 3B, center of revolution thereof is same as the rotation center 100 of the revolving arm 41. The second multi-joint arm 3B has a revolving arm 51 forming a second revolving part installed below the revolving arm 41, a middle arm 52 installed at the revolving arm 51, and a second substrate supporting unit 53 installed at the middle arm 52. The configuration of the second multi-joint arm 3B is substantially same as that of the first multi-joint arm 3A, but there is a difference in a length of a rotation axis of the middle arm 52 such that a height of the second substrate supporting unit 53 is equal to that of the substrate supporting unit 43 of the first multi-joint arm 3A, that is, the first and second substrate supporting units 43 and 53 transfer on a same plane.

The first and second multi-joint arms 3A and 3B are set such that the revolving arms 41 and 51 are on a straight line and the middle arms 42 and 52 are set to approach in a direction to make them overlap with the revolving arms 41 and 51, respectively, in a standard position shown in FIG. 1. Further, in the standard position, the first and second substrate supporting units 43 and 53 are set to face each other, and substantially be at right angles to the revolving arms 41 and 51, respectively. In the first and second substrate supporting units 43 and 53, leading ends thereof are pivoted on the middle arms 42 and 52, and rear ends of advancement/retraction directions are formed of supports 44 and 45, each having a fork shape so as to support the wafer W.

Transfer mechanisms of the first and second multi-joint arms 3A and 3B will be explained with reference to FIG. 4. The revolving arm 41 of the first multi-joint arm 3A is formed to be rotated by a revolution axis 60 of a pipe shape whose rotation center is the revolution center 100. In a leading end of the revolving arm 41, a leading end pulley 62 is installed, which can rotate independent of the revolving arm 41 by a rotation axis 61 that is installed inside the revolution axis 60 of a pipe shape and has the revolution center 100 as a rotation center. In a rear end of the revolving arm 41, a supporting pulley 63 for supporting the middle arm 42 and rotating therewith as a single body is installed rotatably. Here, the supporting pulley 63 is connected to the leading end pulley 62 by a timing belt 64.

The middle arm 42 is fixed to an upper portion of a hollow type rotation axis 65 prepared above the supporting pulley 63. In a leading end of the middle arm 42, a middle pulley 66 of a same diameter, i.e., the same number of teeth as that of the supporting pulley 63, is installed on the same axis therewith. On the other hand, in a rear end of the middle arm 42, a leading end pulley 67 is installed rotatably and connected to the middle pulley 66 by a timing belt 68. The middle pulley 66 is fixed on an axis 66a, which is fixed on the revolving arm 41, through the hollow type rotation axis 65. The first substrate supporting unit 43 is fixed on an upper portion of a rotation axis 69 provided above the leading end pulley 67. Here, the gear ratio of the leading end pulley 62 to the supporting pulley 63 is set to be 2:1 and that of the middle pulley 66 to the leading end pulley 67 is set to be 1:2, so that the first substrate supporting unit 43 is formed to move rectilinearly.

In the second multi-joint arm 3B, reference number 70 indicates a pipe type revolution axis, 71 a pipe type rotation axis, 72 a base pulley, 73 a supporting pulley, 74 a timing belt, 75 a rotation axis, 76 a middle pulley, 76a an axis, 77 a leading end pulley, 78 a timing belt, and 79 a rotation axis. The second multi-joint arm 3B has an exactly same configuration for determining a transfer function as that of the first multi-joint arm 3A, while their other configurations are different in that the rotation axis 71 of the base pulley 72 is formed to surround the revolution axis 60 of the first multi-joint arm 3A, the rotation axis 75 of the middle arm 52 is longer than the rotation axis 65 of the middle arm 42 of the first multi-joint arm 3A, and the like. Thus, the rotation centers of the revolution axis 70 and the rotation axis 71 are the revolution center 100, and the middle arm 52 is set to have substantially the same length as that of the revolving arm 51, the gear ratio of the base pulley 72 to the supporting pulley 73 is set to be 2:1, and that of the middle pulley 76 to the leading end pulley 77 is set to be 1:2.

Figure 4:
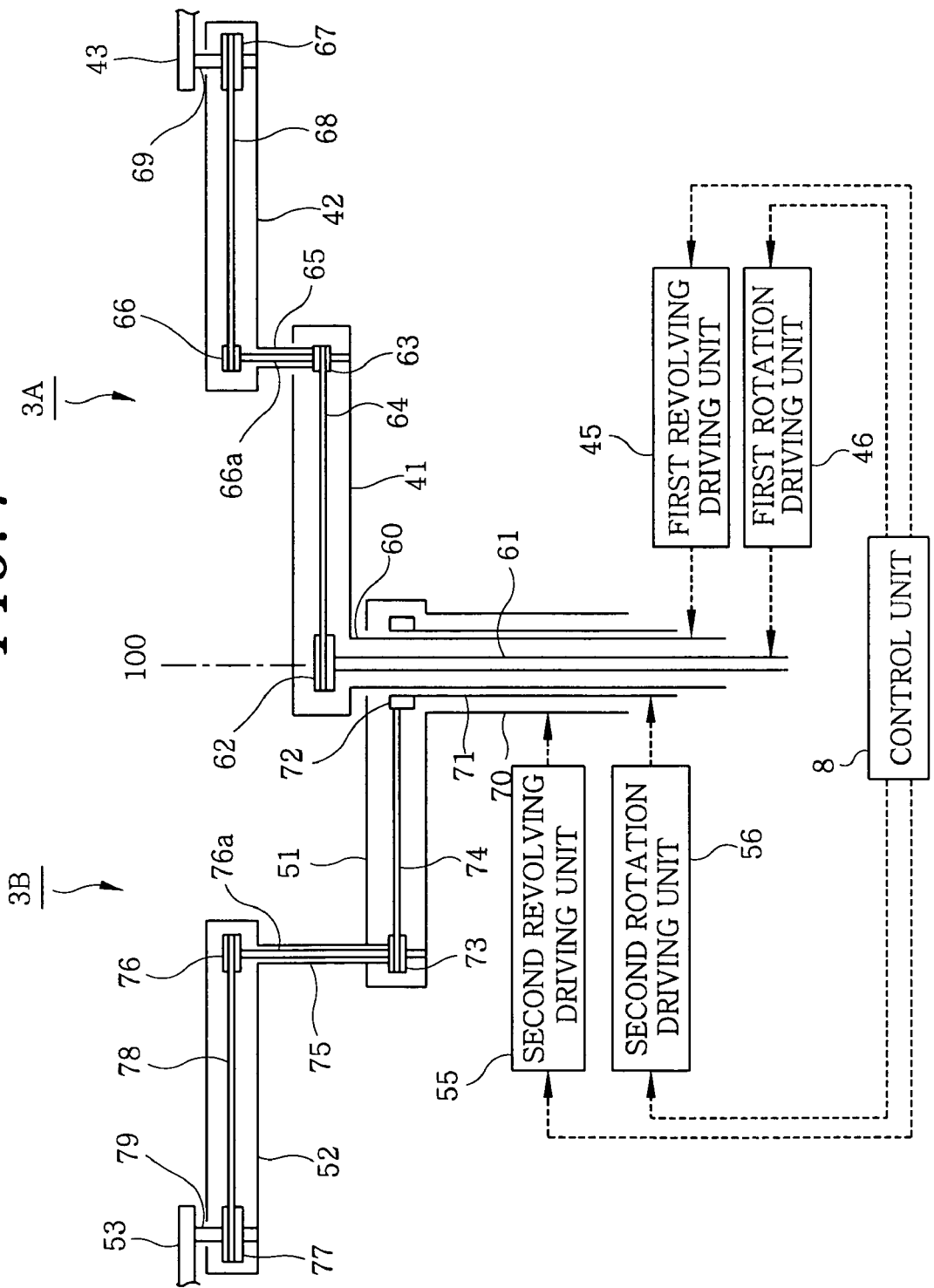
FIG. 4 explains a transfer mechanism of the substrate transfer device.

In FIG. 4, reference numbers 45 and 46 refer to a driving unit of the revolution axis 60 (first revolution axis driving unit) and a driving unit of the rotation axis 61 (first rotation axis driving unit) in the first multi-joint arm 3A, respectively. Reference numbers 55 and 56 indicate a driving unit of the revolution axis 70 (second revolution axis driving unit) and a driving unit of the rotation axis 71 (second rotation axis driving unit) in the second multi-joint arm 3B, respectively. Each of the first and second revolving driving units 45 and 55, and the first and second rotation driving units 46 and 56 corresponds to a mechanism having motor, pulley, belt, and the like. Further, the first rotation axis driving unit 46, each pulley such as the leading end pulley 62, the timing belt, the rotation axis, and the like, correspond to a first advancement/retraction driving unit for advancing and retracting the first substrate supporting unit 43 of the first multi-joint arm 3A. On the other hand, the second rotation axis driving unit 56, each pulley such as the base pulley 72, the timing belt, the rotation axis, and the like, correspond to a second advancement/retraction driving unit for advancing and retracting the second substrate supporting unit 53 of the second multi-joint arm 3B. These first and second revolution axis driving units 45 and 55, and the first and the second advancement/retraction driving unit are controlled by a control unit that will be discussed later.

Figure 5:
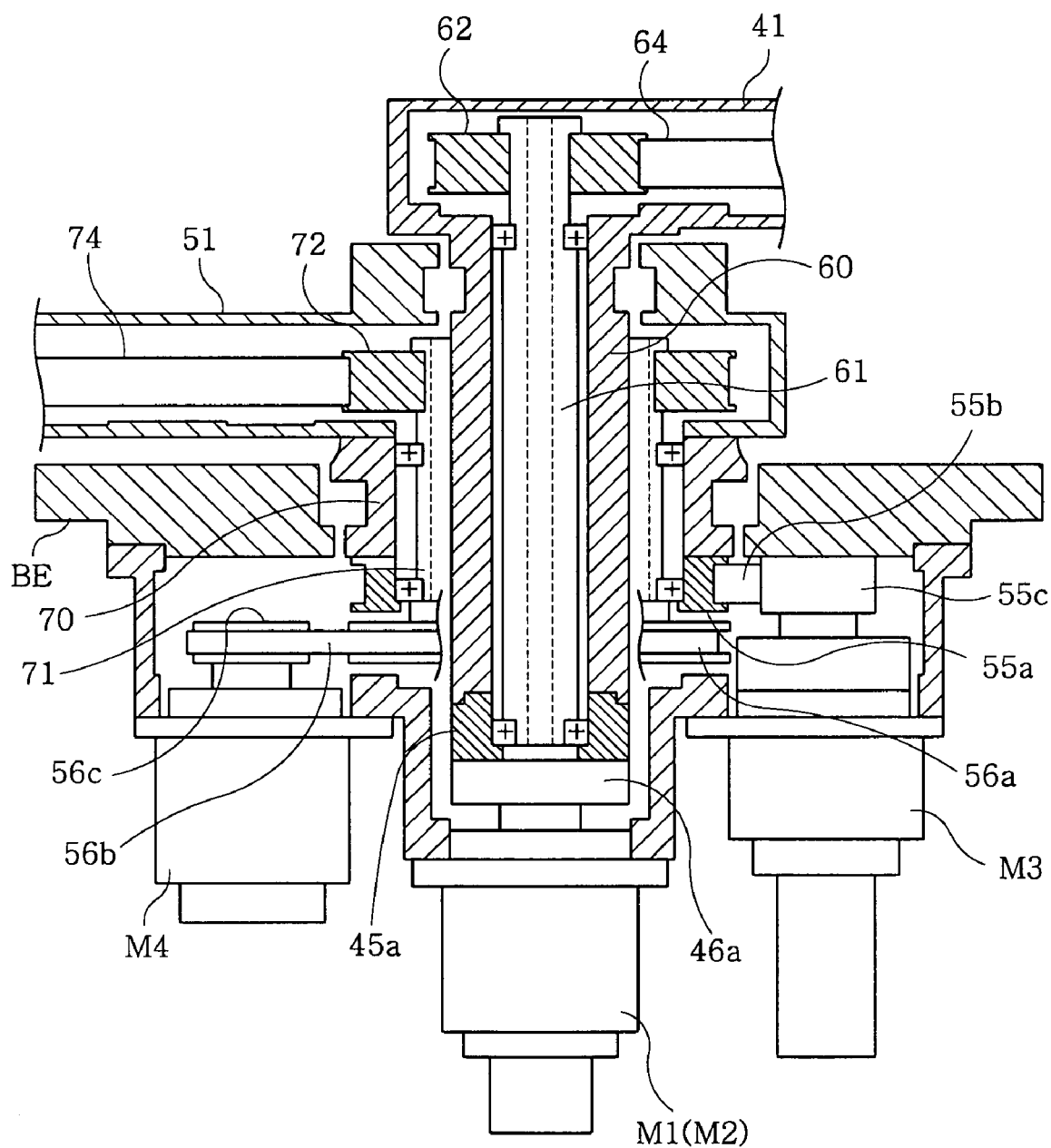
FIG. 5 presents a cross sectional view for showing a structural example in detail of a portion in the substrate transfer device.

Further, FIG. 5 describes an example of a concrete structure for the first and second multi-joint arms 3A and 3B, and a part related thereto. In FIG. 5, reference numbers 45a and 45b indicate pulleys for rotating the revolution axis 60 and the rotation axis 61, respectively. And, the pulleys 45a and 45b are driven by a motor M1 and motor M2 that is hidden behind the motor M1 and not shown. Reference number 55a is a pulley for rotating the revolution axis 70, and the pulley 55a is driven by a motor M3 through a driving pulley 55c and a belt 55b. Reference number 56a is a pulley for rotating the rotation axis 71, and the pulley 56a is driven by a motor M4 through a driving pulley 56c and a belt 56b. The motors M1 to M4 are fixed at a base BE forming a lower plane of the transfer chamber 16.

Operations of such a second substrate transfer device 3 will be explained. In the first multi-joint arm 3A, if the first revolving driving unit 45 corresponding to the driving unit of the revolution axis 60 (referring to FIG. 4) is stopped and the first rotation driving unit 65 corresponding to the driving unit of the rotation axis 61 is operated to rotate the leading end pulley 62, the rotation axis 65 supporting the middle arm 42 tends to rotate. At this time, the rotational force from the driving unit 45 is not applied to the revolution axis 60. However, the revolution axis 60 is in a free state (rotatable state). Therefore, if the leading end pulley 62 rotates clockwise, the middle arm 42 rotates clockwise and at the same time the revolving arm 41 rotates anti-clockwise since the middle arm 42 begins to open for the revolving arm 41.

Figure 6:
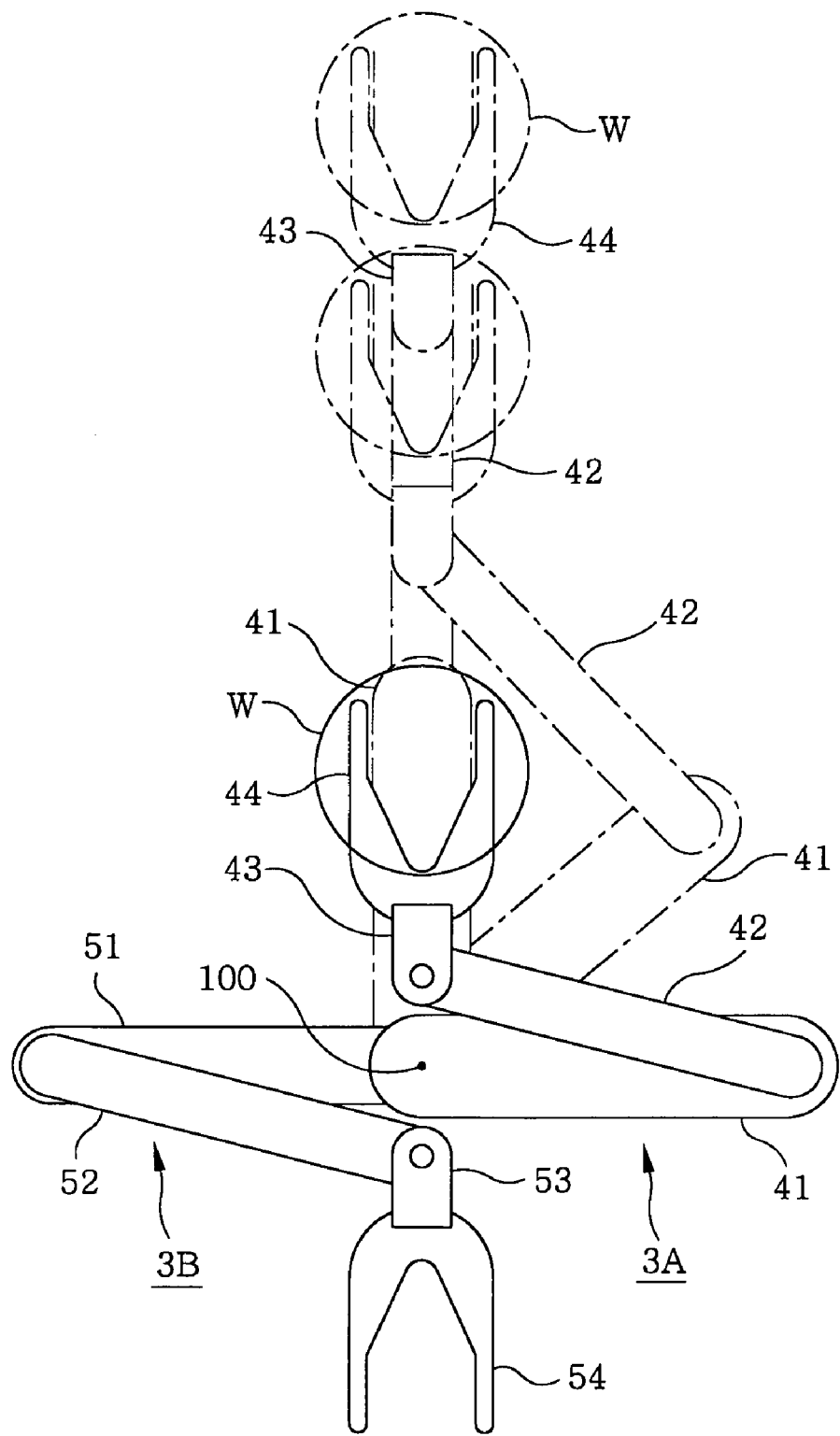
FIG. 6 explains an operation of the substrate transfer device.

Here, if the revolving arm 41 rotates by α degree from the standard position, the middle arm 42 rotates by −2 α degree, since the gear ratio of the leading end pulley 62 to the supporting pulley 63 is 2:1. In addition, if the middle arm 42 rotates clockwise, the middle pulley 66 rotates anti-clockwise with respect to the middle arm 42. As a result, the first substrate supporting unit 43 rotates anti-clockwise by α degree since the gear ratio of the middle pulley 66 to the rear end pulley 67 is 1:2. Therefore, as shown in FIG. 6, if the first substrate supporting unit 43 advances by extending the first multi-joint arm 3A from the standard position, the first substrate supporting unit 43, more specifically, a trajectory of a center position of a wafer W supported by the first substrate supporting unit 43 comes to draw a straight line through the revolution center 100 and perpendicular to the revolving arm 41 on the standard position.

Further, the second multi-joint arm 3B moves like the first multi-joint arm 3A by the second advancement/retraction driving unit. Still further, in a case of reversing the base pulleys 62 and 72 (rotating anti-clockwise) in the first and second multi-joint arms 3A and 3B, the first and second substrate supporting units 43 and 53 move while drawing a trajectory, which is perfectly symmetric with respect to that of the advance direction. Here, the first and second revolving driving units 45 and 55, and the first and the second advancement/retraction driving unit are formed to be controlled independently. As a result, the respective first and second multi-joint arms 3A and 3B can independently conduct revolving operation, and advancing or retracting operation, without interfering each other. By such a construction, the first and second arms 3A and 3B are formed so as to have an access to the preliminary chambers 14 and 15, and the respective vacuum chambers 2 (2A to 2F), independently. Here, the second transfer chamber 16 is of an octagonal shape, and, as for the widths of the vacuum chamber 2 or the preliminary vacuum chambers 14 and 15 connected to the transfer chamber side 16, a central angle from the center of the transfer chamber 16 toward the centers of widths of the chambers adjacent to each other (i.e., an angle formed by centers of the wafers W inside the vacuum chambers 2 or the preliminary vacuum chambers 14 and 15 adjacent to each other, and the center of the transfer chamber 16) becomes 45 degrees. However, even in this case, the first and second multi-joint arms 3A and 3B are made to be accessible to the vacuum chambers 2 (2A to 2F) adjacent to each other.

Now, the flow of a wafer in the aforementioned substrate processing apparatus will be explained. Referring to FIG. 1, unprocessed wafers W are supported in the cassettes C and loaded into the cassette chambers 11 and 12 from outside, and then, the gate doors GD are closed to make the cassette chambers 11 and 12 airtight space. Thereafter, the wafers are taken out from the cassettes C inside the cassette chambers 11 and 12, simultaneously, by means of the first substrate transfer device 19 in the first transfer chamber 13 of, e.g., an inert gas atmosphere, and transferred to the position aligning stages 17 and 18. Here, the first substrate transfer device 19 is made of two multi-joint arms and formed to transfer, e.g., two wafers W, simultaneously.

The two wafers W are adjusted to be aligned along specific directions and loaded into the preliminary vacuum chambers 14 and 15 by the first substrate transfer device 19, respectively. Then, after setting the preliminary vacuum chambers 14 and 15 for, e.g., a specific vacuum atmosphere like the transfer chamber 16, the two wafers W are loaded into a specific vacuum chamber 2 by the second substrate transfer device 3.

Subsequently, a control mechanism of the substrate processing apparatus mentioned above will be explained with reference to FIG. 7. In the drawing, reference number 8 refers to a control unit, and the control unit 8 functions to perform a processing recipe performed in each of the vacuum chambers 2A to 2F, transfer recipes of the first and second transfer devices 19 and 3, or an edition or management of a transfer mode, and the like. And, at the same time, the control unit 8 functions to control the respective vacuum chambers 2A to 2F or the substrate transfer devices 19 and 3 in accordance with such recipes. Practically, the control unit 8 is made of CPU (central processing unit), program, memory, and the like, but it is explained by dividing the functions thereof into some blocks. In this embodiment, the essential point is related to the transferring of the wafer inside the transfer device 16 by the second substrate transfer device 3 and, hereinafter, the description will be centered mainly on this point.

Figure 7:
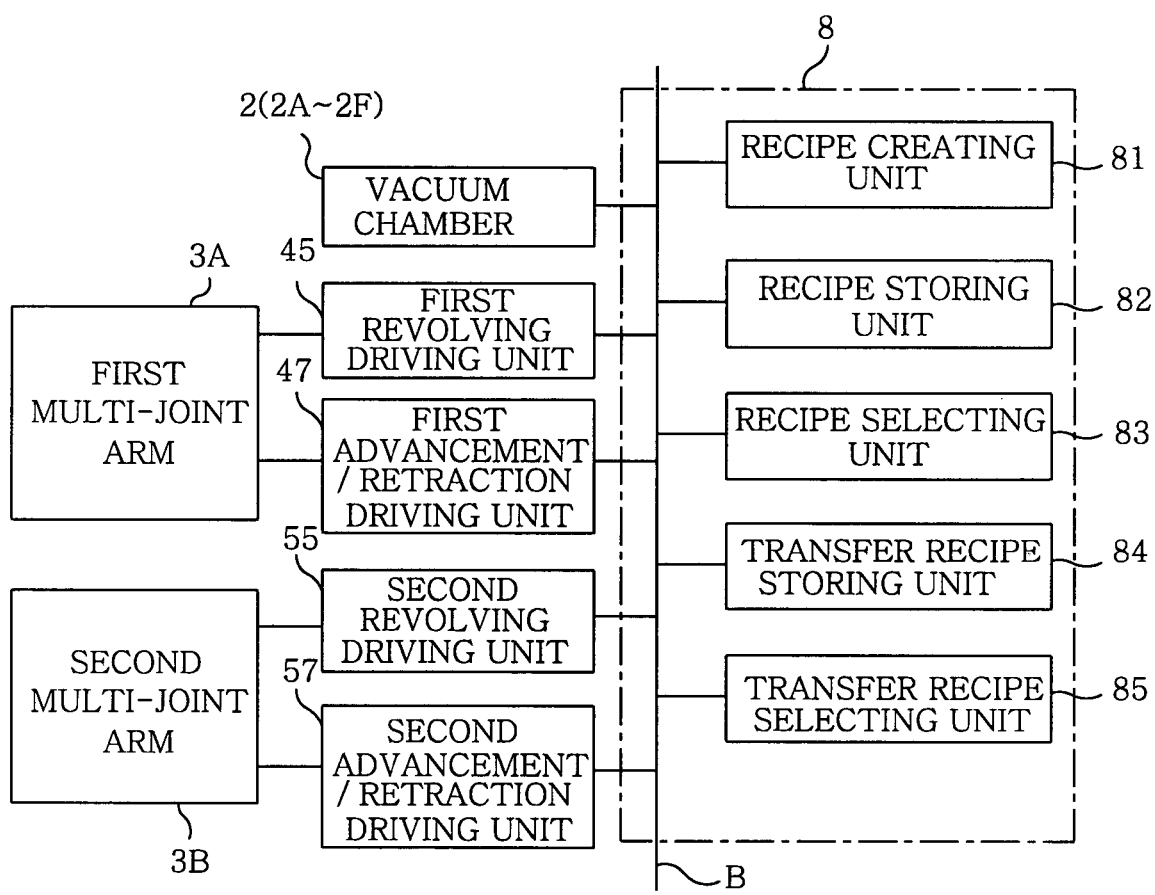
FIG. 7 describes a block diagram for showing a control mechanism of the substrate processing apparatus.
Figure 8:
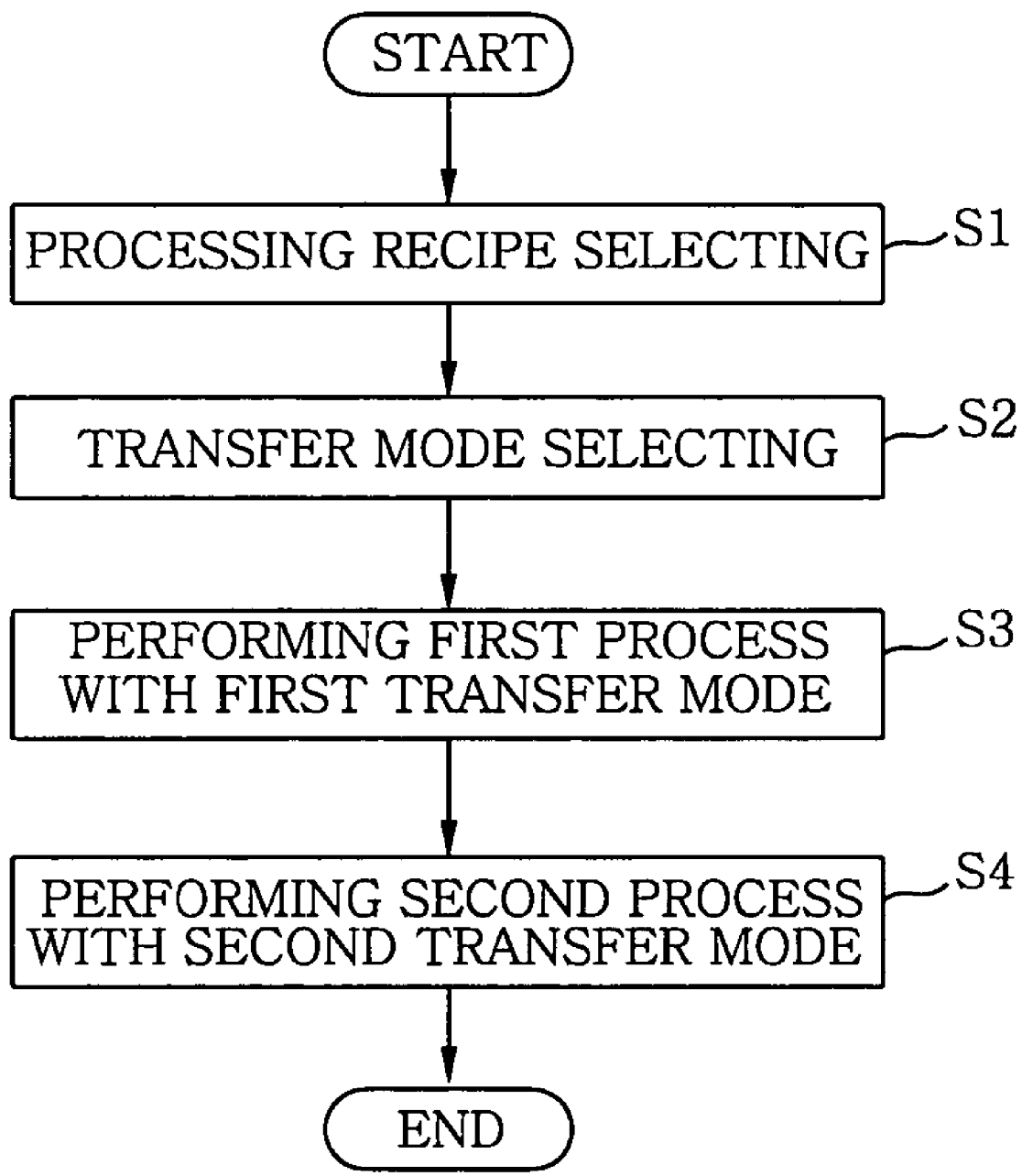
FIG. 8 depicts a flow diagram showing an example for processing performed in the substrate processing apparatus.

In FIG. 7, reference number 81 indicates a processing recipe creating unit, 82 a processing recipe storing unit, 83 a processing recipe selecting unit, 84 a transfer recipe storing unit, and 85 a transfer recipe selecting unit. And, reference number B is a bus. The processing recipe creating unit 81 functions to creates a processing recipe in the respective vacuum chambers 2A to 2F and is formed of a recipe creating program, an operation screen for inputting or editing the recipe, and the like. Here, each of the processing recipes created is stored in the processing recipe storing unit 82. A plurality of processing recipes are provided depending on a desired process and an operator selects a desired processing recipe in the processing recipe selecting unit 83 from the plurality of processing recipes stored in the processing recipe storing unit 82.

Further, the transfer recipe storing unit 84 stores a transfer route of the wafer or two transfer modes by the second transfer device 3. There are first and second transfer modes in the transfer mode, and the transfer mode is memorized in the memory in such a way that the transfer mode is to be associated with a corresponding processing recipe. For example, if a processing recipe is selected, a corresponding transfer mode is selected by the transfer recipe selecting unit 85, on the basis of the processing recipe. In this example, the transfer recipe selecting unit 85 corresponds to means for selecting the transfer mode in accordance with the processing recipe.

The first transfer mode is used in a case of a transfer rate control, and the second transfer mode is used in a case of a process rate control. The transfer rate control and the process rate control are determined by a relation between the transfer time of a wafer in the first and second transfer chambers 13 and 16 and the processing time in the vacuum chambers 2A to 2F where the corresponding wafer is to be transferred thereto. In the case where the transfer time is longer than the processing time, it becomes the transfer rate control, and the wafer is transferred in the first transfer mode. In addition, if the transfer time is shorter than the processing time, it becomes the process rate control and the wafer is transferred in the second transfer mode.

Here, the transfer time of the wafer in the transfer chamber refers to the time taken for an unprocessed wafer to be transferred from the first transfer chamber 13 to specific vacuum chambers 2A to 2F through the preliminary vacuum chambers 14 (15), and conventionally, ranges from 20 to 30 seconds. Thus, for a process adopting the first transfer mode, there may be an ashing process, an etching process on an anti-reflection film, or the like, in which the processing time falls between 20 seconds and 30 seconds. In addition, for a process adopting the second transfer mode, there may be process for making an oxidation film, gate process, contact hole process, or the like, in which the processing time falls between 30 seconds and 20 minutes, e.g., about 5 minutes.

Further, the control unit 8 is connected to the respective vacuum chambers 2A to 2F, the first revolution axis driving unit 45 and the first advancement/retraction driving unit 47 of the first multi-joint arm 3A of the second substrate transfer device 3, and the second revolution axis driving unit 55 and the second advancement/retraction driving unit 57 of the second multi-joint arm 3B, respectively, through a controller (not shown)

Subsequently, a method for transferring a substrate in accordance with the present invention will be explained with reference to FIGS. 8 to 12. First, an operator selects a processing recipe by using the control unit 8. In this example, such a process is performed in which the processing time is shorter than the transfer time, e.g., ashing process in which the processing time is 20 seconds or more and 30 seconds or less, as a first process in the respective vacuum chambers 2A to 2F. Thereafter, the operator selects a recipe for performing such a process in which the processing time is longer than the transfer time, e.g., oxidation film making process whose processing time is about 5 minutes, as a second process in the respective vacuum chambers 2A to 2F (step S1).

Here, in the processing recipe, there are described, e.g., vacuum chambers 2A to 2F to be used, order for use, and the like. For example, such a processing recipe is selected wherein wafers are transferred to all the vacuum chambers 2A to 2F in such an order that the vacuum chamber 2A is the first and the vacuum chamber 2F is the last, and performed the same processing therein; and the preliminary vacuum chambers 14 and 15 are alternately used so that the first preliminary vacuum chamber 14 is employed when the wafer is transferred to the vacuum chamber 2A, and subsequently, the second preliminary vacuum chamber 15 is employed when the wafer is transferred to the vacuum chamber 2B.

If the processing recipe described above is selected, a transfer route or transfer mode of the second substrate transfer device 3, which is stored in the transfer recipe storing unit 84, is automatically selected by the transfer recipe selecting unit 85, on the basis of the corresponding processing recipe. In this case, the first transfer mode is selected in the first process since the processing time is shorter than the transfer time, and, in the second process, the second transfer mode is selected since the processing time is longer than the transfer time (step S2).

Figure 9A:
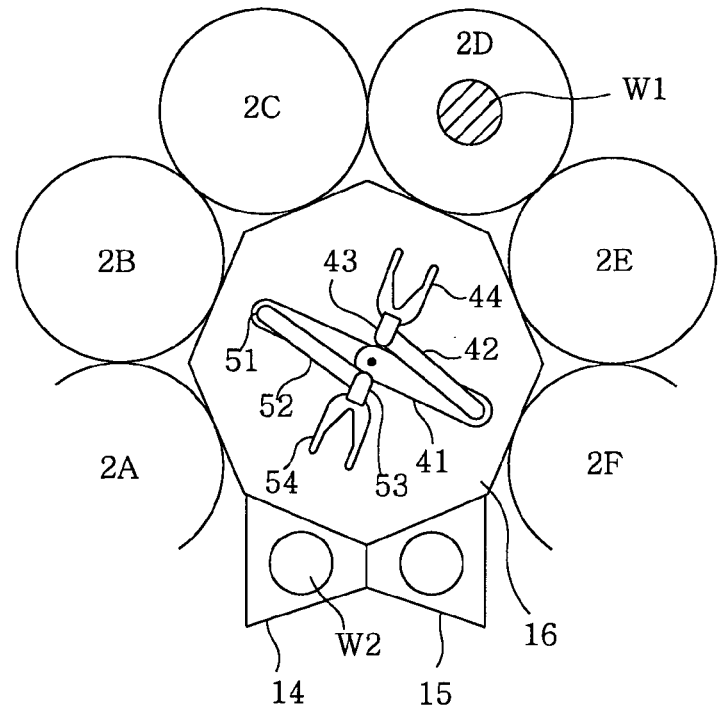
FIGS. 9A and 9B offer a plain view for showing a manner of transferring a wafer in the substrate transfer device.

Further, the first process is performed on the wafer in each of the vacuum chambers 2A to 2F, while transferring the wafer W between the preliminary vacuum chambers 14 and 15 and each of the vacuum chambers 2A to 2F by the second substrate transfer device 3 in the first transfer mode (step S3). Now, the first transfer mode will be explained with reference to FIGS. 9A to 11. FIG. 9A shows that vacuum processing on a wafer W1 is completed in a vacuum chamber 2D, for example, and a wafer W2 to be processed next stands by in the first preliminary vacuum chamber 14.

In such a state, for example, the first and second substrate supporting units 43 and 53 of the second substrate transfer device 3 simultaneously extend to reach for a processed wafer W1 of the vacuum chamber 2D and unprocessed wafer W2 of the first preliminary vacuum chamber 14, respectively. Then, the first and second substrate supporting units 43 and 53 of the second substrate transfer device 3 enter into the vacuum chamber 2D and the first preliminary vacuum chamber 14, respectively, so as to receive the wafers W1 and W2 by the supports 44 and 54 thereof (referring to FIG. 9B).

Figure 10A:
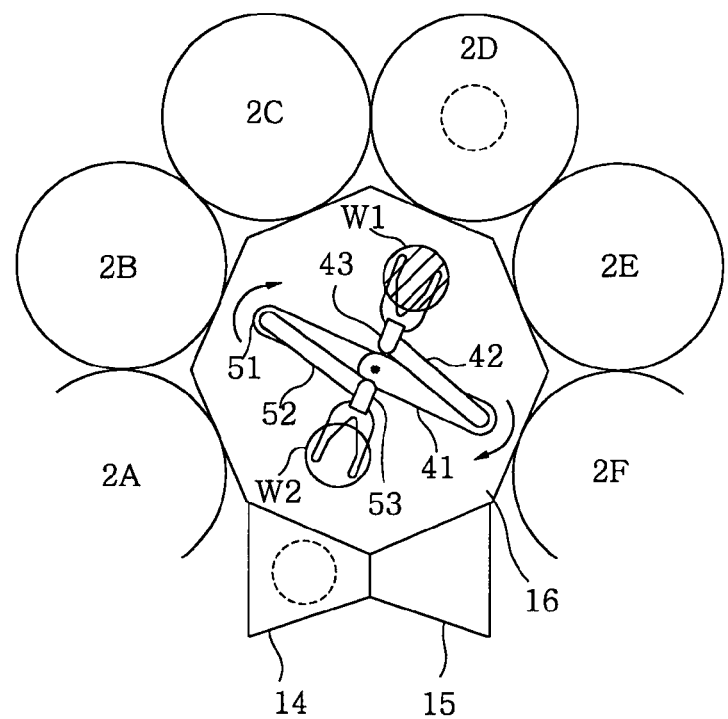
FIGS. 10A and 10B set forth a plain view for showing a manner of transferring a wafer in the substrate transfer device.
Figure 10B:
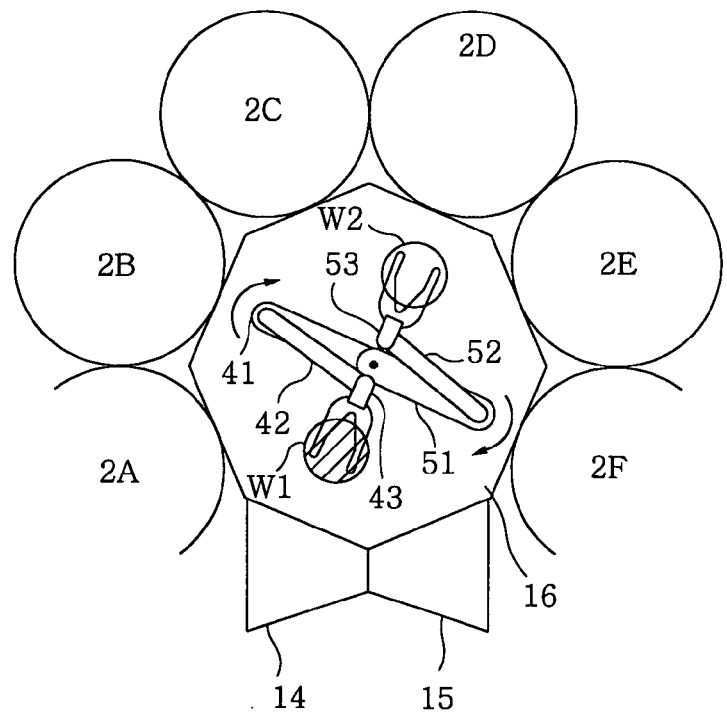
Figure 11:
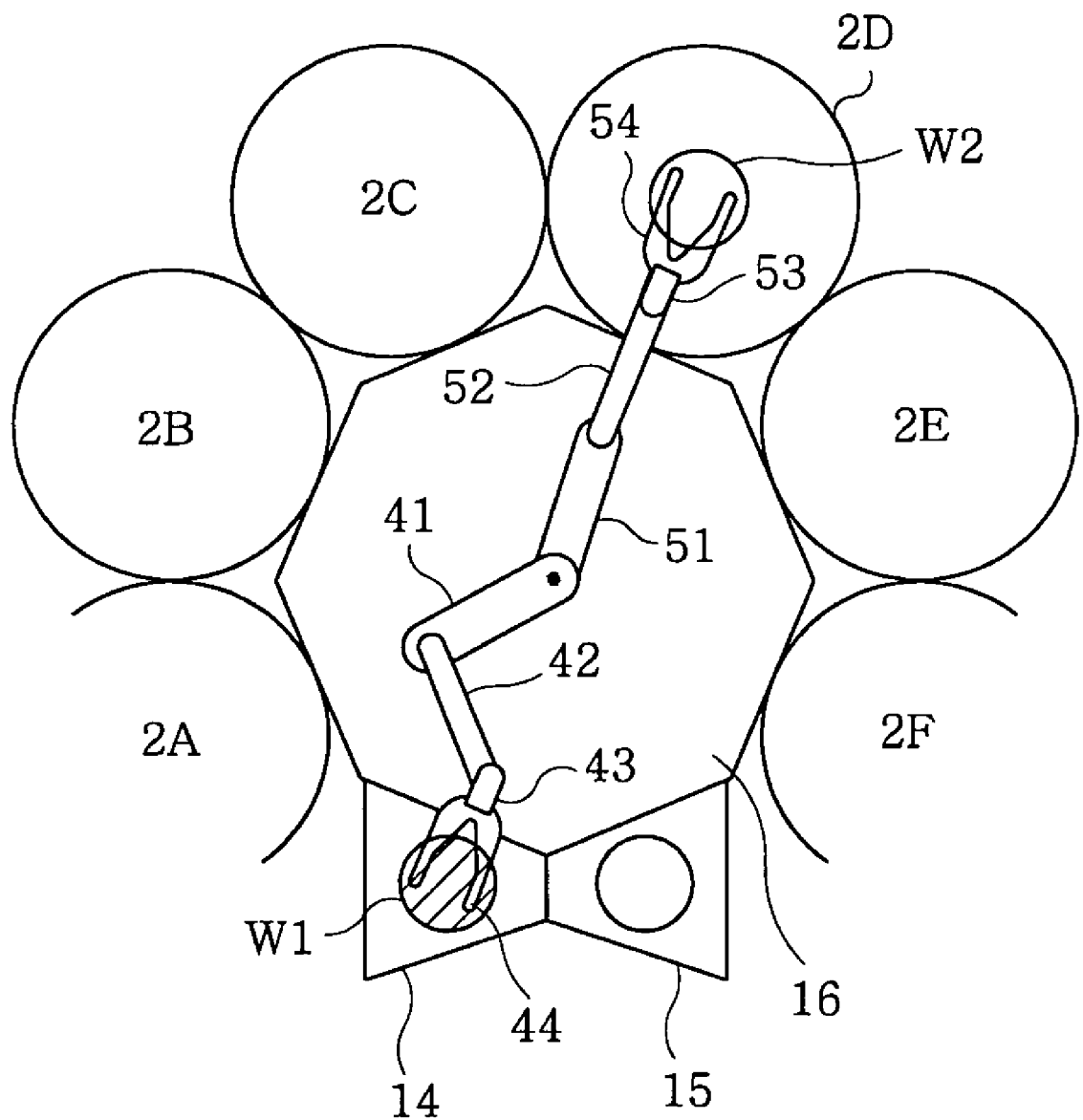
FIG. 11 presents a plain view for showing a manner of transferring a wafer in the substrate transfer device.

Subsequently, as shown in FIG. 10A, the first and second substrate supporting units 43 and 53 return to the standard position, and then, the second substrate supporting unit 53 revolves by specific angles, i.e., 180 degrees in this example, to a position accessible to the vacuum chamber 2D, as shown in FIG. 10B (particularly, the aforementioned revolving arms 41 an 51 revolve by 180 degrees). Thereafter, as shown in FIG. 11, the unprocessed wafer W2 supported by the support. 54 of the second substrate supporting unit 53 is delivered into the vacuum chamber 2D, and, at the same time, the processed wafer W1 supported by the support 44 of the first substrate supporting unit 43 is delivered to the first preliminary chamber 14. Here, when the aforementioned first and second substrate supporting units 43 and 53 are said to simultaneously receive (or deliver) the wafers W, it is understood that it is not strictly limited to the case of receiving the wafers exactly at the same time. Such a case in which timing shift generated when receiving (or delivering) the wafer is 0.5 second or less may be included.

As described above, the processed wafer W1 in the vacuum chamber 2D is replaced by the unprocessed wafer W2 in the first preliminary vacuum chamber 14. Then, for example, a processed wafer W3 in a vacuum chamber 2E is exchanged for an unprocessed wafer W4 of the second preliminary vacuum chamber 15. In this case, replacing the wafer W3 with the wafer W4 is performed in the same manner. The first and second substrate supporting units 43 and 53 for supporting the wafers W3 and W4, respectively, shrink simultaneously so as to return to the standard position. Then, the second substrate supporting unit 53 revolves by a specific angle to a position accessible to the vacuum chamber 2E. Thereafter, the second and first substrate supporting units 53 and 43 are extended simultaneously, so that the unprocessed wafer W4 supported by the support 54 of the second substrate supporting unit 53 is loaded into the vacuum chamber 2E, and, at the same time, the processed wafer W3 supported by the support 44 of the first substrate supporting unit 43 is loaded into the second preliminary vacuum chamber 15.

Therefore, the wafers are transferred among all the vacuum chambers 2A to 2F and the first and second preliminary vacuum chambers 14 and 15, and the first process is performed on the wafers in the vacuum chambers 2A to 2F.

Figure 12A:
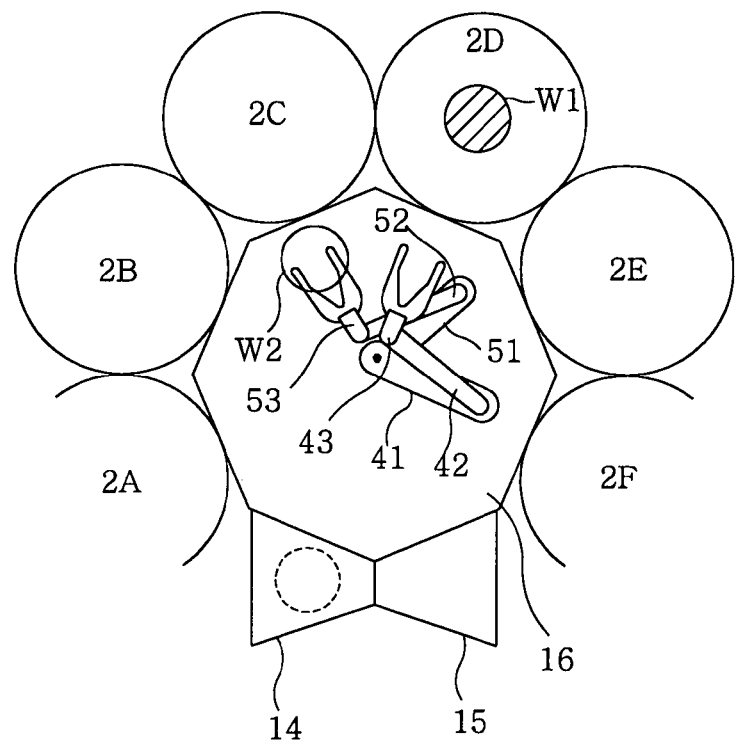
FIGS. 12A and 12B explain a plain view for showing another manner of transferring a wafer in the substrate transfer device.

Next, the second process is performed on the wafers in the respective vacuum chambers 2A to 2F, while transferring the wafer among the preliminary vacuum chambers 14 and 15 and the respective vacuum chambers 2A to 2F by the second substrate transfer device 3, in the second transfer mode (step S4). Now, the second transfer mode will be explained with reference to FIGS. 12A to 14. FIG. 12A shows that the second substrate transfer device 3 stands by, waiting for completion of the process in a corresponding vacuum chamber 2D, while vacuum processing is performed on a wafer W1 in the vacuum chamber 2D, for example.

In such a waiting state, for example, the first and second substrate supporting units 43 and 53 of the second substrate transfer device 3 are placed in waiting positions. In other words, the first substrate supporting unit 43 of the second substrate transfer device 3 is disposed in a position that it has access to the vacuum chamber 2D, and the second substrate supporting unit 53 is disposed in the vicinity of the vacuum chamber, if possible; for example, the second and first substrate supporting units 53 and 43 are disposed in such a position that an angle formed therebetween becomes about 45 degrees. At this time, the second substrate supporting unit 53 approaches for the unprocessed wafer W2 to the first preliminary vacuum chamber 14 in advance, and thus supporting the wafer W2 by the corresponding substrate supporting unit 53.

Figure 12B:
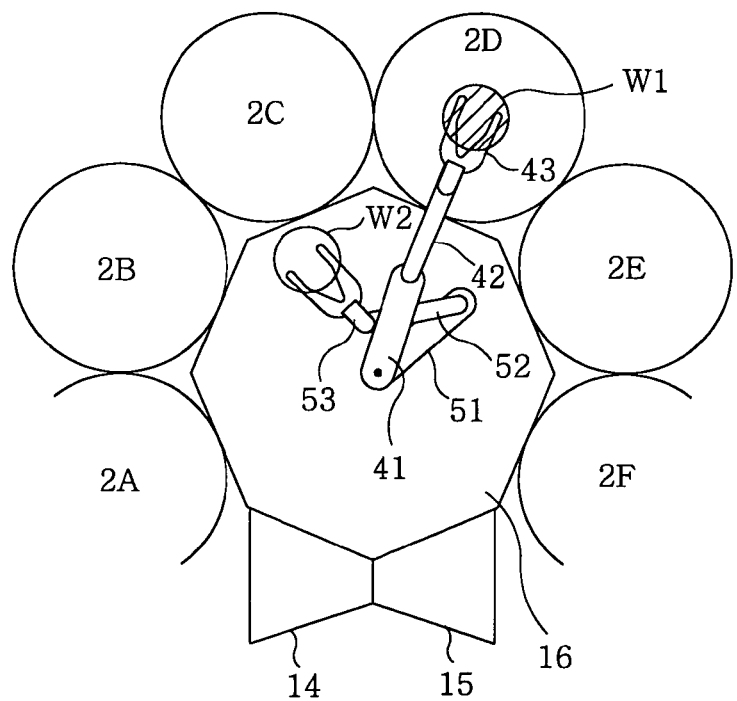
Figure 13A:
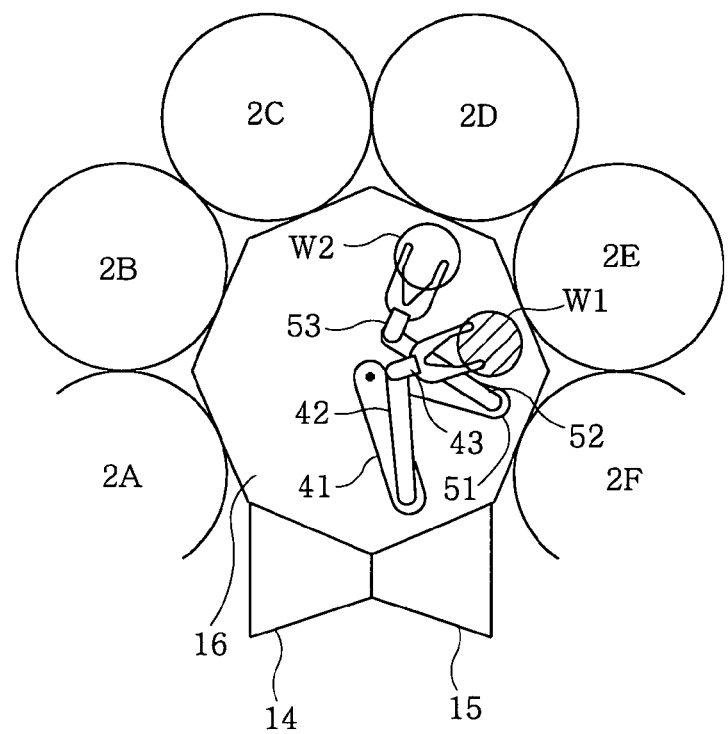
FIGS. 13A and 13B describe a plain view for showing another manner of transferring a wafer in the substrate transfer device.
Figure 13B:
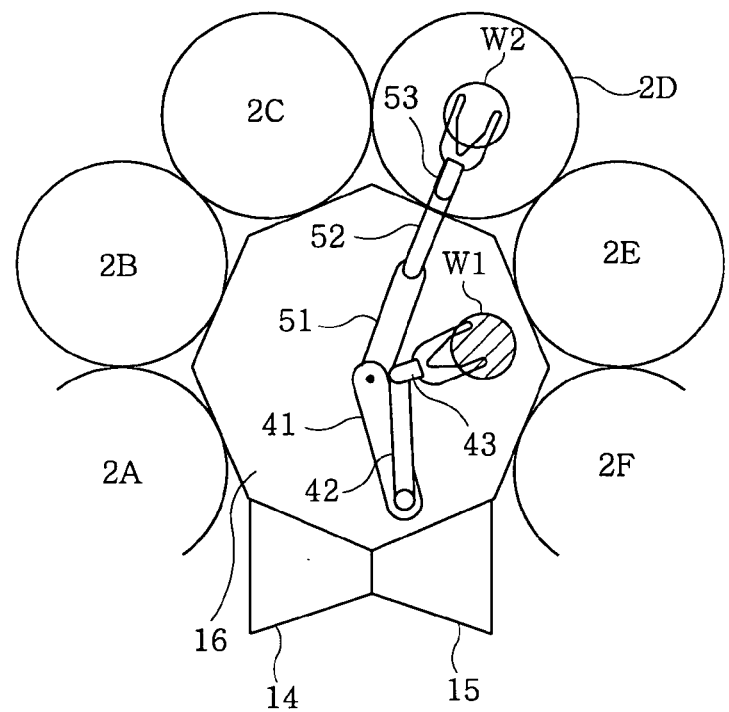
Figure 14:
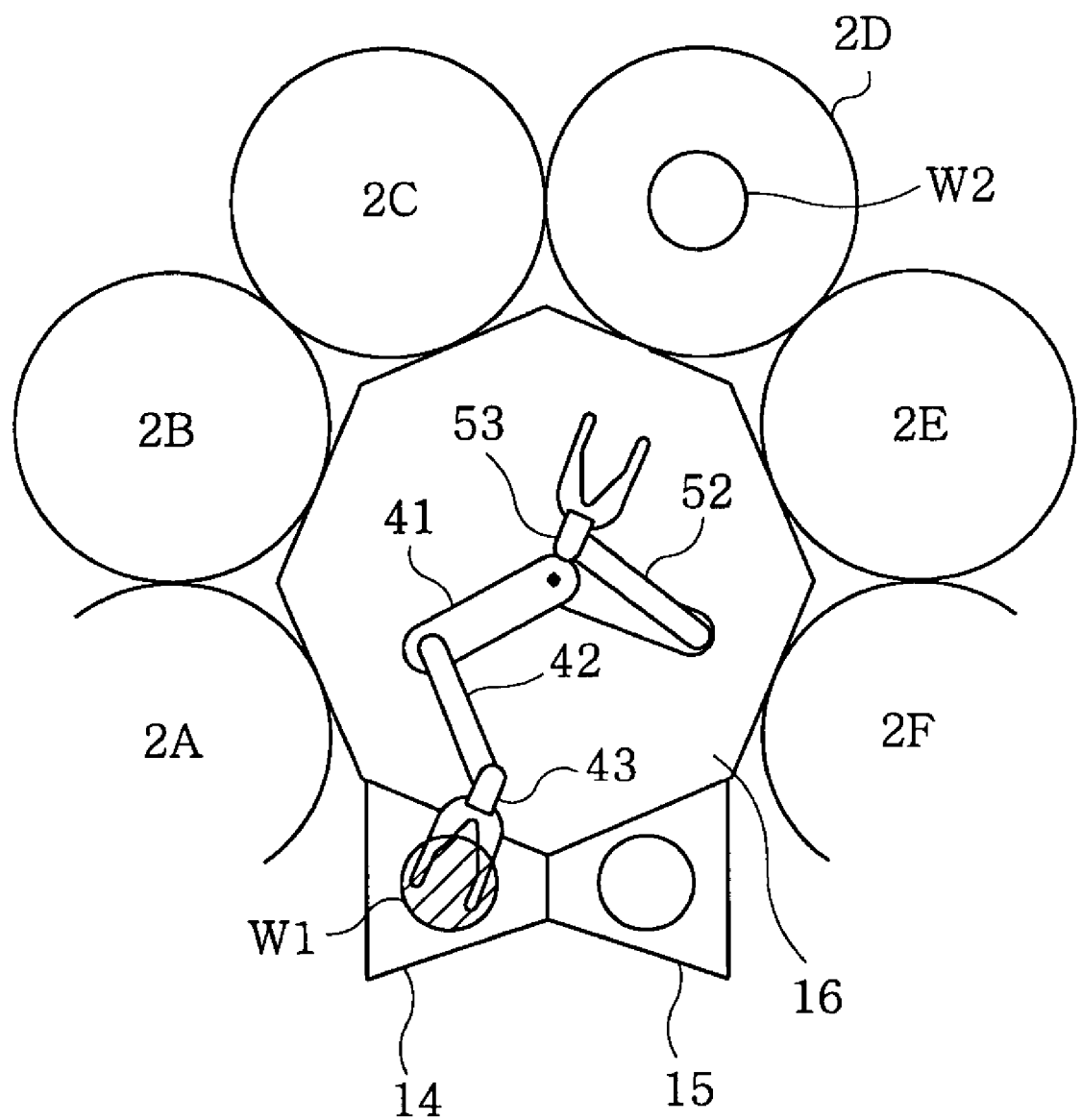
FIG. 14 depicts a plain view for showing another manner of transferring a wafer in the substrate transfer device.

Next, after completing the process in the vacuum chamber 2D, the first substrate supporting unit 43 enters into the corresponding vacuum chamber 2D and immediately receives the processed wafer W1, as shown in FIG. 12B. After that, the substrate supporting unit 43 returns to the waiting position, and subsequently, the second substrate supporting unit 53 revolves by a specific angle, i.e., about 45 degrees in this example, to a position accessible to the vacuum chamber 2D (FIG. 13A). Then, as shown in FIG. 13B, the unprocessed wafer W2 supported by the support 54 of the second substrate supporting unit 53 is loaded into the vacuum chamber 2D, and subsequently, the substrate supporting unit 53 returns to the waiting position. As shown in FIG. 14, the first substrate supporting unit 43 approaches to have access to the first preliminary vacuum chamber 14 to thereby unload the processed wafer W1 supported therein into the first preliminary vacuum chamber 14.

As described above, after replacing the processed wafer W1 in the vacuum chamber 2D with the unprocessed wafer W2 from the first preliminary vacuum chamber 14 in the second transfer mode, and then, the processed wafer W3 in the vacuum chamber 2E is replaced with the unprocessed wafer W4 from the second preliminary vacuum chamber 15 in the same manner, for example. Thus, the wafers are transferred between all the vacuum chambers 2A to 2F and the first and second preliminary vacuum chambers 14 and 15 in the second transfer mode, and the second process is performed on the wafers in the vacuum chambers 2A to 2F.

In this embodiment, the first and second multi-joint arms 3A and 3B are disposed such that the center of revolution thereof are the same, and the vacuum chambers 2A to 2F are circumferentially installed around the revolution center of the first and second multi-joint arms 3A and 3B. Therefore, a radius of the second substrate transfer device 3 is small and a footprint thereof can be small.

At this time, the driving units 45 and 55 for revolving and the driving units 46 and 56 for rotation (for expansion and contraction) are provided in the first and second multi-joint arms 3A and 3B, respectively, and the first and second multi-joint arms 3A and 3B are formed to be controlled independently. As a result, the first and second multi-joint arms 3A and 3B can have access to the vacuum chambers 2A to 2F arbitrarily, and simultaneously access the neighboring chamber 2. Thus, a wafer can be transferred with a high efficiency even in a narrow transfer region.

Further, in the embodiment mentioned above, a wafer can be transferred efficiently whether the process time is shorter or longer than the transfer time, since the transfer mode is selected on the basis of the processing time. In other words, if the processing time is shorter than the transfer time, i.e., transfer rate control, the first and second substrate supporting units 43 and 53 simultaneously go for processed and unprocessed wafers, and simultaneously transfer same to the preliminary vacuum chambers 14 and 15 and the vacuum chamber 2, respectively.

As described above, by operating the first and second substrate supporting units 43 and 53 simultaneously, wherein while one substrate supporting unit 43 (53) moves, the other substrate supporting unit 53 (43) stands by. In addition, the unnecessary waiting time is eliminated. Therefore, it is possible to transfer a wafer efficiently and further reduce the transfer time. In the case of the transfer rate control mentioned above, the total processing time is determined by the transfer time, so that reduction of the transfer time depends on reduction of the total processing time. Therefore, the throughput can be enhanced.

Further, in case where the processing time is longer than the transfer time, i.e., process rate control, one substrate supporting unit 43 (53), which transfers the processed wafer to a position accessible to the vacuum chamber 2 in which a process is performed in advance, stands by, so that the processed wafer can be taken out right after the process in the vacuum chamber 2 ended. In addition, the other substrate supporting unit 53 (43) is disposed in the vicinity of one substrate supporting unit 43 (53), if possible, to thereby stand by for the end of the process in the vacuum chamber 2, while supporting the unprocessed wafer therein. As a result, the revolution angle becomes small when the substrate supporting unit 53 (43) having access to the vacuum chamber 2 into which the wafer W is loaded, whereby the wafer W can be loaded into the vacuum chamber 2 in a short time.

After replacing the processed wafer W with the unprocessed wafer W in the vacuum chamber 2 in a short time and starting a vacuum processing on the wafer W in the corresponding vacuum chamber 2, the processed wafer W supported by one substrate supporting unit 43 (53) is transferred to the preliminary vacuum chambers 14 and 15. As described above, by transferring the wafer to the preliminary vacuum chambers 14 and 15 while performing a specific process in the vacuum chamber 2, the waiting time for the processing in the vacuum chamber 2 can be used efficiently and the wafer can be transferred efficiently, whereby throughput can be enhanced.

Further, the transfer mode of the second substrate transfer device 3 is selected on the basis of the processing time on the wafer W in the vacuum chamber 2, so that the wafer is transferred by a technique corresponding to the processing time, and the wafer can be transferred efficiently regardless whether the processing time is shorter or longer than the transfer time. In other words, if it is intended to transfer the wafer in the second transfer mode, for example, in case where the processing time is shorter than the transfer time, the first and second substrate supporting units 43 and 53 have access to the vacuum chamber 2 and the preliminary vacuum chamber 53 (43) individually, in the second transfer mode. As a result, while one substrate supporting unit 43 (53) moves, the other substrate supporting unit 53 (43) should stand by. Accordingly, it takes much time to transfer, and thus, throughput becomes lowered.

Meanwhile, if the wafer is transferred in the first transfer mode in case where the processing time is longer than the transfer time, the first and second substrate supporting units 43 (53) have access to the vacuum chamber 2 and the preliminary vacuum chamber 14 (15), simultaneously, in the first transfer mode. As a result, the first and second substrate supporting units 43 and 53 cannot perform other operations and should stand by until the process on the wafer is completed in the vacuum chamber 2. Accordingly, after completing the process on the wafer in the vacuum chamber 2, operations are performed as follows: going for the processed wafer and the unprocessed wafer to the vacuum chamber 2 and the preliminary vacuum chamber 14 (15), respectively; returning the first and the second substrate supporting units 43 and 53 to the standard position; and revolving the first and second substrate supporting units 43 and 53 by specific angles. As mentioned above, since the long processing time cannot be used efficiently, the total processing time becomes long and throughput becomes lowered. Thus, it is effective in improving the transfer efficiency that the transfer mode of the second substrate transfer device is selected on the basis of the processing time on the wafer W in the vacuum chamber.

Further, in the substrate transfer device mentioned above, the preliminary vacuum chambers 14 and 15 and the second transfer chamber 16 are set to have specific degree of vacuum, but it takes too much time to exhaust therein up to the specific degree of vacuum. Thus, it is important to improve the transfer efficiency of the wafer in the transfer chamber 16, for enhancing the total process throughput.

Subsequently, in case where other processes are performed in the vacuum chambers 2A to 2F, transfer of the wafer W will be explained. In this example, there is selected a process recipe in which a first process in which the processing time is shorter than the transfer time in the vacuum chambers 2A and 2B, a second process in which the processing time is longer than the transfer time in the vacuum chambers 2C and 2D, and a third process in which the processing time is shorter than the transfer time in the vacuum chambers 2E and 2F are performed. If such a processing recipe is selected, a transfer route or transfer mode of the second substrate transfer device 3 that is stored in the transfer recipe storing unit 84 is automatically selected by the transfer recipe selecting unit 85, on the basis of the corresponding processing recipe. In this case, the first transfer mode is selected in the first process since the processing time is shorter than the transfer time, the second transfer mode is selected in the second process since the processing time is longer than the transfer time, and the first transfer mode is selected in the third process since the processing time is shorter than the transfer time.

Further, the first process is performed on the wafer W in the vacuum chambers 2A and 2B while transferring the wafer W in the first transfer mode between the preliminary vacuum chambers 14 and 15 and the vacuum chambers 2A and 2B by the second substrate transfer device 3. The second process is performed on the wafer W in the vacuum chambers 2C and 2D while transferring the wafer W in the second transfer mode between the preliminary vacuum chambers 14 and 15 and the vacuum chambers 2C and 2D by the second substrate transfer device 3. And, the third process is performed on the wafer W in the vacuum chambers 2E and 2F while transferring the wafer W in the first transfer mode between the preliminary vacuum chambers 14 and 15 and the vacuum chambers 2E and 2F by the second substrate transfer device 3.

As mentioned above, even in case where other processes are performed in the vacuum chamber 2, the wafer W can be transferred to the vacuum chamber 2 efficiently, the total processing time may be shortened, and the throughput can be enhanced, since the transfer mode is selected according to the process of the vacuum chamber.

In the aforementioned examples, the processes are performed in all the vacuum chambers, but unused vacuum chambers may be left. Further, in the aforementioned examples, the preliminary vacuum chambers 14 and 15 are employed alternately, but one preliminary vacuum chamber 14 (15) may be used continuously. Still further, the aforementioned examples explain that the wafer is transferred to the second transfer chamber 16, for example, in case that one chamber corresponds to the vacuum chamber 2 of a substrate processing chamber and the other chamber corresponds to the preliminary vacuum chambers 14 and 15 of loading/unloading chamber. However, in case where a consecutive process is performed on the wafer by using the vacuum chambers 2A to 2F continuously, for example, the wafer may be transferred between the vacuum chambers 2 in the first or second transfer mode. Here, the transfer time refers to the time required for transferring the wafer from one chamber before delivering and to the other chamber after that, when delivering the wafer in one chamber into the other chamber other than one chamber.

Further, in the present invention, it may be possible that a recipe for processing and a transfer mode are written in the recipe itself in advance, in the control unit 8, and, if a specific recipe is selected, the transfer mode may be selected at that time. In addition, a controlling panel, which is formed such that the transfer mode is selected manually, is provided, so that the operator may select the processing recipe and the transfer mode by oneself manually.

Still further, the second substrate transfer device 3 is not limited to the aforementioned configuration, but it may be of such a configuration that the first and second revolving units can revolve around a common revolution center, and the first and second substrate supporting units disposed in a same plane can advance and retreat by the first and second revolving units and the first and second advancement/retraction driving units. For example, a substrate transfer device, e.g., so-called block type arm, may be employed, which has a configuration such that the first and second substrate supporting units are equipped in the first and second robot link mechanisms formed to revolve, and the first and second substrate supporting units appear and disappear by extending and shrinking the robot link mechanisms.

Still further, in the present invention, all the chambers installed around the transfer chamber having a substrate transfer device are substrate processing, chambers. For example, the present invention can be applied to an apparatus that a wafer is loaded into a corresponding transfer chamber from one substrate processing chamber and a wafer is unloaded from another substrate processing chamber. In addition, the substrate processing chamber is not limited to a sheet type vacuum processing chamber, but it may be a sectional space including, e.g., a vertical type batch furnace for performing a heat treatment with a batch furnace, and a loading area of, e.g., inert gas atmosphere. Still further, the object to be processed of the present invention is not limited to a semiconductor wafer, but the present invention may be applied to a processing on a large scale LCD (Liquid Crystal Display) substrate.

Figure 15:
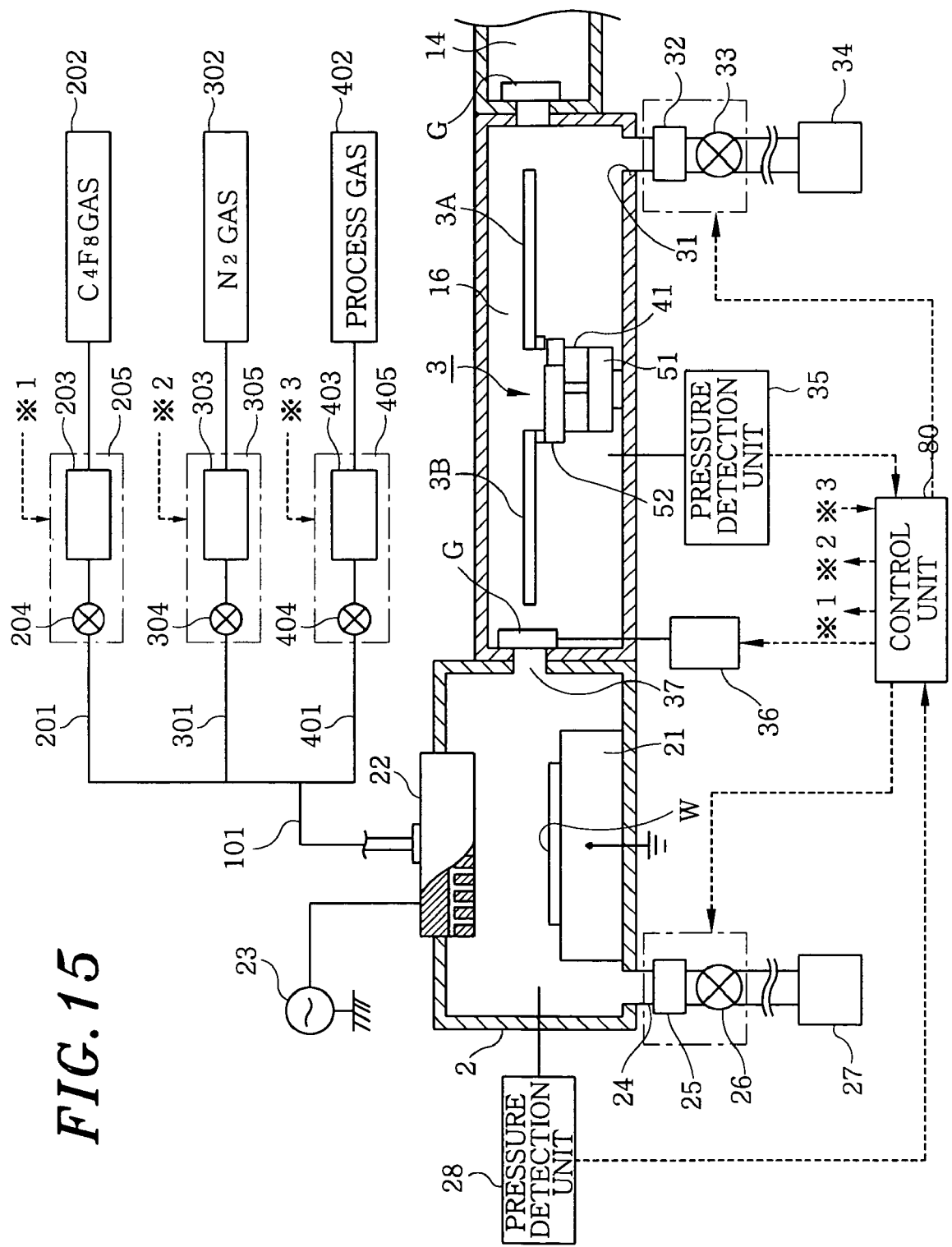
FIG. 15 describes a cross sectional view of a preferred embodiment in accordance with of a substrate processing apparatus of the present invention.

Next, another preferred embodiment of the present invention whose an object is to prevent a wafer from being contaminated due to particles would be explained. In this embodiment, additional construction is added to the substrate processing apparatus shown in FIGS. 1 and 2. FIG. 15 is a view for showing a configuration of the corresponding embodiment, and it describes omitted parts and newly added constructions in the aforementioned substrate processing apparatus.

In this embodiment, a vacuum chamber 2 of a substrate processing chamber will be described as a chamber for performing dry etching. A gas supply unit 22 installed in the substrate processing chamber 2 (for the convenience of explanation, hereinafter, the vacuum chamber 2 will be described as the substrate processing chamber 2) is coupled to a high frequency power source 23 and forms an upper electrode, and a mounting table 21 is grounded and forms a lower electrode. A gas exhaust unit 24 forming a gas exhaust line is coupled to a bottom plane of the substrate processing chamber 2. To this gas exhaust unit 24, a pressure control unit 25, an opening/closing valve 26, and a vacuum pump 27 of a vacuum exhausting means are coupled in that order starting from the substrate processing chamber 2 side. In addition, a pressure detection unit 28 for detecting the inner pressure of the chamber is installed in the substrate processing chamber 2.

A gas supply line 101 is coupled to the gas supply unit 22, and an upstream thereof is divided into a plurality of branch lines 201, 301, and 401. Here, the branch lines 201, 301, and 401 are coupled to a purge gas supply source for peeling of particles 202, a purge gas supply source for pressure control 302, and a process gas supply source 402, respectively. The purge gas for peeling of particles functions to remove the particles, which will be peeled off from the interior of the substrate processing chamber 2 when letting the purge gas for pressure control or process gas flow thereafter, by using a viscous force thereof, in advance. As for the purge gas for peeling of particles, it is preferable that a gas having larger viscous force, i.e., molecular weight, than that to be supplied later including the purge gas for pressure control or process gas is employed. For example, there may be employed rare gas such as Xe (xenon) gas, Rn (radon) gas, Kr (krypton) gas, or the like, or CF based gas such as C5F8 gas, C4F8, or the like. In the present embodiment, C4F8 gas is used.

Further, as the purge gas for pressure control, e.g., N2 (nitrogen gas) is used, and, as the process gas, halogen based etching gas or the like is used. In the branch lines 201, 301, and 401, a gas supply kit 205 having a flow rate control unit 203 and a valve 204, a gas supply kit 305 having a flow rate control unit 303 and a valve 304, and a gas supply kit 405 having a flow rate control unit 403 and a valve 404 are installed, respectively.

A part related to the second transfer chamber 16 will be explained. A gas exhaust unit 31 forming a gas exhaust line is coupled to a bottom plane of the transfer chamber 16. A pressure control unit 32, an opening/closing valve 33, and a vacuum pump of a vacuum exhaust means 34 in that order starting from the transfer chamber 16 side are coupled to the gas exhaust unit 31. In addition, a pressure detection unit 35 for detecting the inner pressure of the chamber is installed in the transfer unit 16. Reference number 36 indicates a driving mechanism for opening and closing a gate valve G of a sluice valve, and reference number 37 is assigned to a transferring port for passing a wafer W between the substrate processing chamber 2 and the transfer chamber 16.

Atmospheres of the substrate processing chamber 2 and the transfer chamber 16, and the opening/closing of the gate valve G are controlled by a control unit 80 formed of a computer. The control unit 80 functions to control the gas supply kits 205, 305, and 405 including the flow rate control units 203, 303, and 403, which are installed in the branch lines 201, 301, and 401 of the gas supply lines, and the like; to input pressure detecting values of the pressure detection units 28 and 35, and, at the same time, control the inner pressures of the substrate processing chamber 2 and the transfer chamber 16; and to open and close the gate valve via the driving mechanism 36, by using a program memorized in a memory.

The program requires as one of conditions for opening the gate valve G between the substrate processing chamber 2 and the transfer chamber 16 that pressure in all the substrate processing chamber 2 and the transfer chamber 16 are set to be less than 66.5 Pa (500 mTorr). As a result, the inner pressure of the transfer chamber 16 is set to be an equal or less value than the aforementioned value, e.g., 26.6 Pa (200 mTorr). The program is formed to perform a flowchart shown in FIG. 16, and the contents thereof will be described in the part where operations of the apparatus are explained.

Next, operations of the present embodiment will be described with reference to FIG. 16. Here, it will be explained in relation to the opening and closing of the gate valve G between the substrate processing chamber 2 and the transfer chamber 16 corresponding to main parts of the present embodiment, in FIG. 1 showing the entire substrate processing apparatus, since it has already been explained in the previous embodiment how the wafer W, i.e., substrate, flows in the apparatus.

Figure 9B:
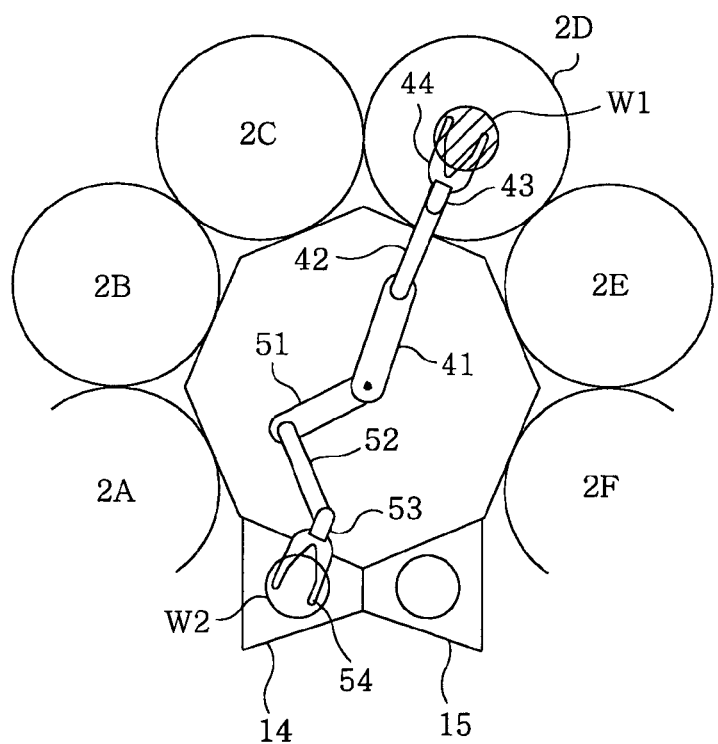

Now, it is assumed that the processing on the wafer W1 is completed in the substrate processing chamber 2D, and the corresponding wafer W1 is unloaded by the substrate transfer device 3, as shown in FIGS. 9A and 9B, to thereby be in the state shown in FIGS. 10A and 10B. At this time, the gate valve G of the substrate processing chamber 2D side is closed at first (step S1). Then, the valve 201 is opened and so-called full-purge is performed by flowing C4F8 gas of the purge gas for peeling of particles into the substrate processing chamber 2 with a flow rate of Q0 by controlling the flow rate control unit 203 (step S2). While the substrate transfer device is operated, the opening and closing valve 26 is in the open state. Thus, C4F8 gas passes through the interior of the substrate processing chamber 2, whereby particles attached to the wall or surface of the mounting table 21 are peeled off by the viscous force thereof.

Here, an object for performing the full-purge is to peel off the particles in advance, which will be peeled off from the substrate processing chamber 2 by the viscous forces of the purge gas for pressure control provided into the substrate processing chamber 2 before opening the gate valve G and the process gas provided after loading the wafer W, and to suppress the scattering of the particles when the gases passes through. At this time, it is required to let the purge gas pass through for peeling off the particles so as to have a viscous force greater than the viscous forces when letting the aforementioned gases pass through. The viscous force is proportional to the molecular weight of the purge gas and the square of the flow rate. Therefore, it is necessary to investigate the maximum values of the viscous forces in advance when the purge gas for pressure control and the process gas pass through, on the basis of each flow rate and molecular weight thereof, and to let the purge gas for peeling of particles flow so as to obtain a viscous force larger than the maximum values.

Therefore, for the convenience of explanation, if the viscous force has the maximum value when the N2 gas for pressure control flows with a flow rate Q1, and N2 gas is employed as the purge gas for peeling of particles, it is necessary to let same with a flow rate larger than the flow rate Q1 flow. In this example, C4F8 gas is employed as the purge gas for peeling of particles. Thus, if the flow rate Q0 is larger than square root of the ratio of the molecular weights of N2 to C4F8 (28/200), larger viscous force can be obtained than that exerted when the N2 gas for pressure control with a flow rate Q1 is flowing. As mentioned above, from the fact that the flow rate can be small to obtain large viscous force, i.e., larger viscous force can be obtained by increasing the flow rate, it is preferable that the molecular weight of the purge gas for peeling of particles is larger than that of the purge gas for pressure control. In addition, it is obvious by the following experimental example that the scattering of the particles is suppressed when the gas is supplied continuously, by performing such a full-purge.

After performing the full-purge described above, for example, supplying the C4F8 gas is stopped, the valve 304 is opened, and N2 gas of the purge gas for pressure control flows in the substrate processing chamber 2 with a flow rate Q1 by controlling the flow rate control unit 303, and the inner pressure of the substrate processing chamber 2 is adjusted to have a setting value (step S3). The setting value of the pressure is smaller than that of the transfer chamber 16 and larger than ½ of that. For example, if the setting value of the pressure in the transfer chamber is 26.6 Pa (200 mTorr), that of the substrate processing chamber is set for 20 Pa (150 mTorr).

Subsequently, the inner pressure P0 of the transfer chamber 16 (the pressure detection value of the pressure detection unit 35) is compared with that P1 of the substrate processing chamber 2 (the pressure detection value of the pressure detection unit 28), so that it is determined whether P0 is larger than P1 or not (step S4). After that, it is determined whether P0 is less than 66.5 Pa (500 mTorr) (step S5) and P0 is less than twice P1, i.e., the pressure difference therebetween is less than twice P1 (step S6).

As can be easily seen from the following experimental example, the reason why steps S4 to S6 are performed is for confirming whether such a condition is satisfied that the pressures of both vacuum chambers are less than 66.5 Pa (500 mTorr) and a higher one of the pressure detection values is less twice a lower one thereof when the valve is opened, since under such a condition, generation of the shockwaves becomes sufficiently small. Meanwhile, the pressure in the substrate processing chamber 2 is made to be lower than that in the transfer chamber 16, based on the experience that the scattering of the particles is reduced more than in an opposite case. However, it may be reasoned that if the shock waves enter into the substrate processing chamber 2 from outside, the influence of the viscous force of the air current provided into the substrate processing chamber 2 is smaller than that in the case where the shock waves go out of the substrate processing chamber 2. However, the present invention is not limited thereto and the pressure in the substrate processing chamber 2 may be set to be larger than that in the transfer chamber 16.

Through steps S4 to S6, if it is confirmed that each of the conditions is satisfied, the gate valve G is opened (step S7), a next wafer W2 is loaded into the substrate processing chamber 2 by the substrate transfer device 3, as shown in FIGS. 10B and 11 (step S8), and the processing on the wafer W2 is performed after closing the gate valve G (step S9). In the concrete example of such a processing, an etching gas of the process gas, e.g., CF based gas, is supplied into the substrate processing chamber 2, and, at the same time, high frequency powers are applied between the gas supply unit 22 of the upper electrode and the mounting table 21 of the lower electrode so as to make the etching gas be in the plasma state, thereby performing an etching process on the surface of the wafer W2 by using the plasma. After the etching process being completed, supplying the process gas is suspended, the process gas is exhausted from the processing chamber 2, and, at the same time, the steps corresponding to steps S3 to S7 of FIG. 16 are performed. In other words, the interior of the substrate processing chamber 2 is purged with N2 gas to adjust the pressure, the gate valve G is opened after confirming that the aforementioned conditions are satisfied, and the wafer W is unloaded from the substrate processing chamber 2.

Further, it is commonly considered that steps S4 to S6 are performed in a predetermined order, but, in case where the inner pressure P1 in the substrate processing chamber 2 is greater than that P0 in the transfer chamber 16, the control unit 80 performs a process for lowering the inner pressure of the substrate processing chamber 2 by a predetermined amount through the pressure control unit 25 (step S10). Still further, if the pressure P0 in the transfer chamber 16 is greater than 66.5 Pa (500 mTorr), the interior of the transfer chamber 16 is exhausted continuously. In case when the pressure in the transfer chamber 16 P0 remains greater than 66.5 Pa (500 mTorr) even while the transfer chamber is continuously being exhausted for a predetermined time, e.g., an alarm is given, because of a concern that any problems may have developed (steps S11 to S13). Still further, in case when P0 is greater than twice P1, a step for increasing the pressure in the substrate processing chamber 2 by a predetermined value is performed by the pressure control unit 25 (step S14).

In accordance with the embodiment described above, the shock waves are sufficiently suppressed since the gate valve G is opened under such conditions that P1 is less than P0 and P0 is less than twice P1 (the pressure difference therebetween is less than twice). As a result, contamination of the wafer due to the particles can be suppressed. In addition, the purge gas for peeling of particles passes through the substrate processing chamber 2 with viscous force larger than that exerted when the purge gas for pressure control and the process gas being supplied, so that the peeling due to the flowing of the purge gases can be suppressed in both cases when the purge gas for pressure control being supplied and a process being performed. Therefore, it is possible to prevent the wafer from being contaminated by the particles.

In this example, the substrate processing chamber and the transfer chamber correspond to the first and second vacuum chambers, respectively. But, the present invention is applicable between the transfer chamber and the preliminary vacuum chamber. In this case, the purge gas for peeling of particles is supplied such that the viscosity thereof becomes greater than that exerted when the purge gas for pressure control is flowing.

Figure 17:
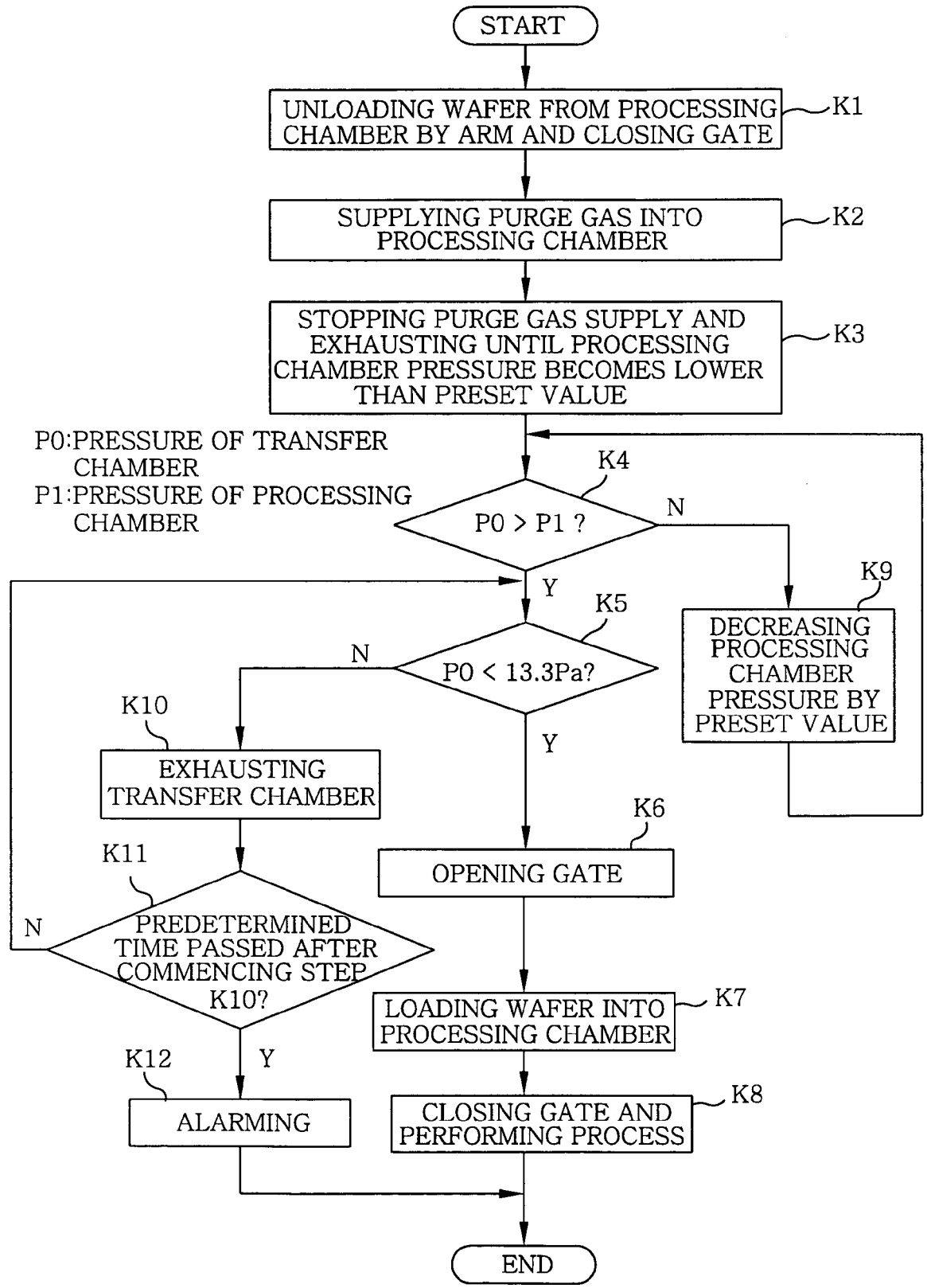
FIG. 17 explains a flowchart for showing another example of an operation before and after opening/closing a gate valve, in the substrate processing apparatus.

Another preferred embodiment of the present invention whose an object is to prevent contamination of a wafer due to the particles, as described above, would be explained. This embodiment has a different program memorized in the control unit 80 in the configuration of FIG. 15. FIG. 17 shows operations performed on the basis of the program of the example, and the condition for opening the gate valve G is that both inner pressures of the transfer chamber 16 and processing chamber 2 are less than 13.3 Pa (100 mTorr). Even in this case, the flow rate is adjusted such that the viscous force of the gas for peeling of particles is larger than that exerted when the process gas is supplied, since the processed wafer W is unloaded from the substrate processing chamber 2 (step K1), and the purge gas for peeling of particles is supplied into the substrate processing chamber 2, while the purge gas for pressure control is not supplied (step K2).

After supplying the purge gas for peeling of particles, supplying such purge gas is suspended, and the purge gas is exhausted until the inner pressure in the processing chamber 2 becomes less than a setting value (step K3). Subsequently, the inner pressure P0 in the transfer chamber 16 is compared with that P1 in the substrate processing chamber 2, so that it is determined whether P0 is greater than P1 (step K4), as in the previous embodiment. After that, if it is confirmed that P0 is less than 13.3 Pa (100 mTorr) (step K5), like the previous embodiment, the gate valve G is opened (step K6), the wafer W2 is loaded into the substrate processing chamber 2 (step K7), and the processing is performed on the wafer W2 after closing the gate valve G (step K8). In addition, steps K9 to K12 correspond to the steps S10 to S13 of the previous embodiment.

In such embodiment, the gate valve G is opened regardless of the pressure difference if the inner pressures in the substrate processing chamber 2 and transfer chamber 16 are less than 13.3 Pa (100 mTorr). As can be seen from the following experimental example, generation of the particles can be suppressed, in this case, too. In such a technique, both pressures are low, so that energy of the shock wave is small even if there is the pressure difference. Therefore, it is considered that the particles are hardly peeled off. In this example, both pressures are controlled to be less than 13.3 Pa (100 mTorr), but it is more preferable that the setting value is 9.98 Pa (75 mTorr), as will be seen from the following experiment.

Figure 16:
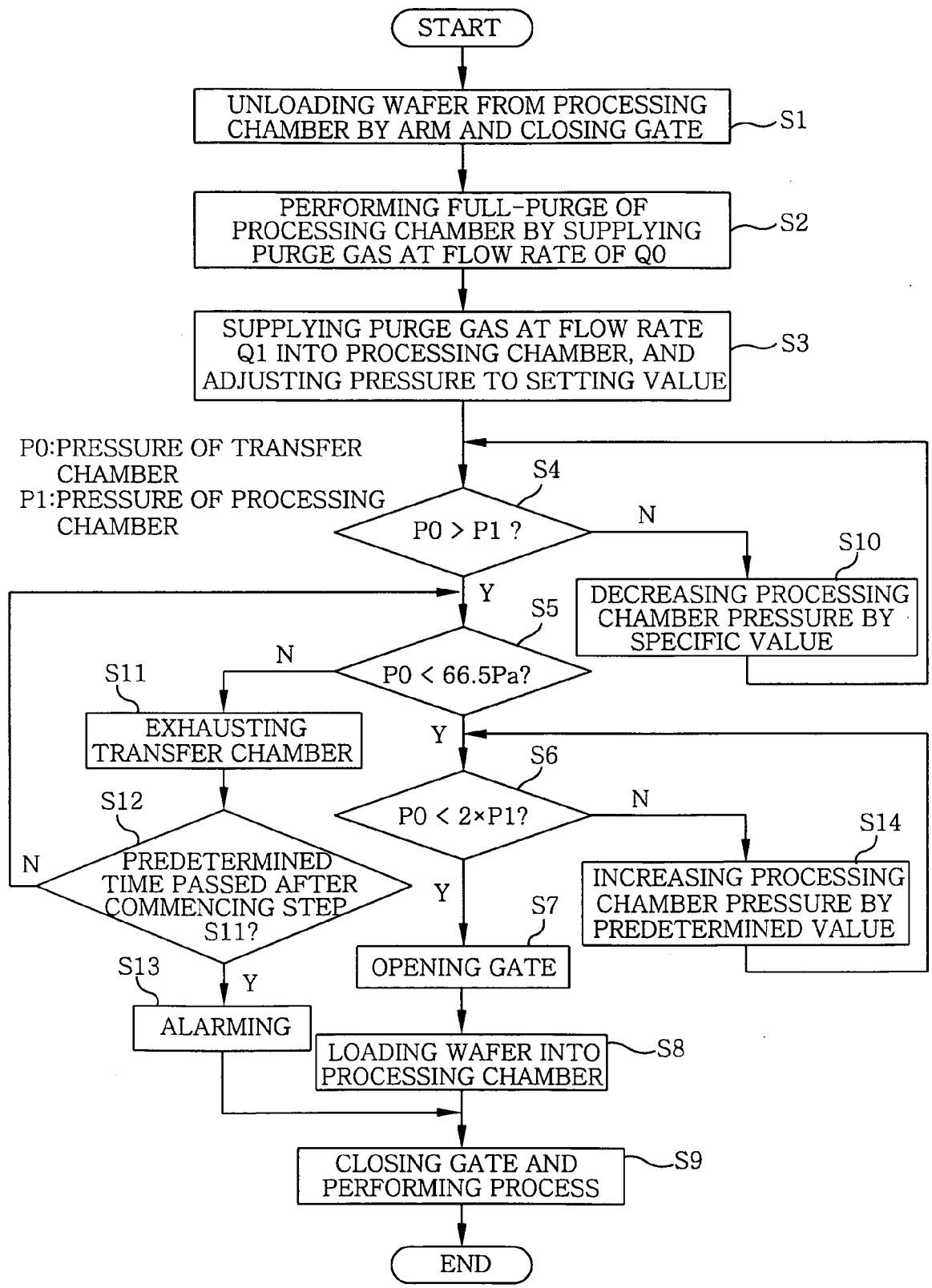
FIG. 16 offers a flowchart for showing an example of operations before and after opening/closing a gate valve, in the apparatus described in FIG. 15.

In the present invention, it may be allowed to form the program in the control unit 80 such that modes in the flows of FIGS. 16 and 17 are changed and performed. For example, in such a mechanism that the inner pressure in the transfer chamber 16 increases when the gate valve G between the preliminary vacuum chambers 14 and 15 (referring to FIGS. 1 and 2) and the transfer chamber 16 being opened, the pressure difference mode of FIG. 16 is preferably selected in case where the processing time performed in the substrate processing chamber 2 is short, since it takes long time to lower the inner pressure of the transfer chamber 16. On the other hand, it is preferable to select a very small amount of pressure mode in case where the processing time is long. Therefore, by changing the mode, a proper mode can be selected on the basis of the process, and thus contributing to enhance the throughput, for example.

Next, an experiment for confirming the effect of the present invention will be explained. As shown in FIGS. 18 and 19, some portions 601 to 603 of the wall in the substrate processing chamber 2 are made of quartz so as to have light transmittance property, a laser can be illuminated to the interior of the substrate processing chamber 2 by a laser beam illumination device 501, and, at the same time, the interior of the substrate processing chamber 2 is formed to be photographed by using a CCD camera 502 as a light-receiving means of a scattered light due to particles. Each of reference numbers 503 and 504 indicates a slit, and reference number 504 is a light extinction device.

By using such an experimental device, particle powders are attached to a lower plane of the gas supply unit 22, and it is observed by the CCD camera 502 whether the particles are scattered or not when opening the gate valve G, while varying the pressures in the transfer chamber 16 and substrate processing chamber 2. Then, a scattering probability is investigated by repeatedly performing it many times. The result is as shown in FIG. 19. In FIG. 19, the horizontal axis indicates the pressure in the transfer chamber 16 and the vertical axis is the scattering probability of particles. Here, the inner pressure of the substrate processing chamber 2 is set within a range of the pressure described on the upper right side of the drawing, in each pressure in the transfer chamber 16.

In case where the pressure P0 of the transfer chamber 16 is 66.5 Pa, the scattering probability of particles is as small as 20% (black circle) when the pressure P1 of the substrate chamber 2 is 39.9 Pa. But, under the same condition, the scattering probability is 50% if P0 is 79.8 Pa. In addition, if P1 is 26.6 Pa (white square), the scattering probability is 25% when P0 is 53.2 Pa, and the scattering probability is 0% when P0 is 56 Pa. Considering the relation between the pressure difference and the scattering probability and each pressure from such results, it can be noted that the scattering of particles is difficult if both P0 and P1 are small, even though the pressure ratio is the same; the peeling of the particles can be suppressed by making the pressure difference less than twice, i.e., making a higher one of the pressure detection values less than twice a lower one thereof, if P0 and P1 are less than 66.5 Pa; and it is more preferable that both pressures becomes less than 53.2 Pa (400 mTorr).

Further, when the pressure P0 of the transfer chamber 16 is 13.3 Pa (100 mTorr), the scattering probability is small, just a little bit more than 10% even if the pressure P1 in the substrate processing chamber 2 is 1.86 Pa. And, when P0 is 9.98 Pa (75 mTorr), the scattering probability is 0% even if the P1 is 1.86 Pa. Thus, it can be known that the peeling of the particles can be suppressed if both pressure are 13.3 Pa (100 mTorr) or less, and preferably, 9.98 Pa (75 mTorr).

Figure 20:
FIG. 20 explains a flow rate of a purge gas provided into a chamber and a state of particle generation.
Figure 21:
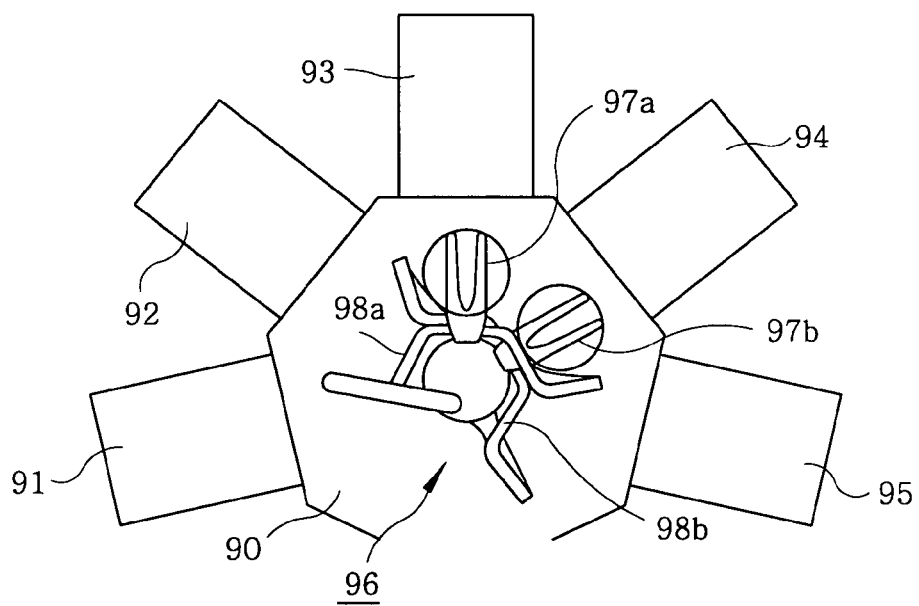
FIG. 21 sets forth a plain view of a conventional substrate processing apparatus.

Still further, it is investigated whether there are particles or not, by supplying (passing) N2 gas into the substrate processing chamber while increasing the flow rate thereof step by step, while the gate valve G closed. The results shown in FIG. 20 can be obtained. In the right side of the drawing of FIG. 20, arrows are provided. In all cases where the flow rate is being decreased from 500 sccm to 400 sccm, and from 800 sccm to 700 sccm, the particles are generated before decreasing the flow rate but they are not generated after decreasing it. In other words, if N2 gas flows with 500 sccm, for example, the viscous force becomes larger than the case of 400 sccm, so that all the particles to be peeled off are peeled if N2 gas flows with the flow rate smaller than that. It means that if N2 gas flows with 400 sccm thereafter, the particles are not peeled off. Therefore, it can be effective technique for suppressing the scattering of the particle that the purge gas for peeling of particles is supplied in advance, as described above.

Figure 18A:
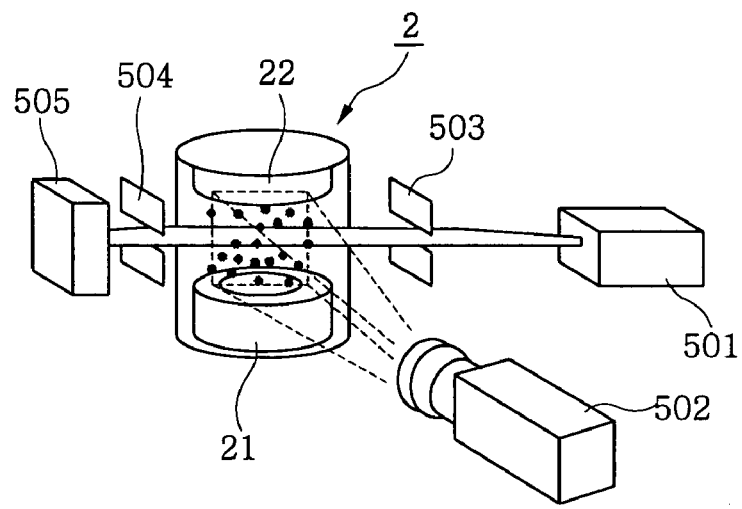
FIG. 18A describes a perspective view and FIG. 18B depicts a transverse sectional view for showing an exemplary configuration of a device used for counting particles generated in a substrate processing chamber.
Figure 18B:
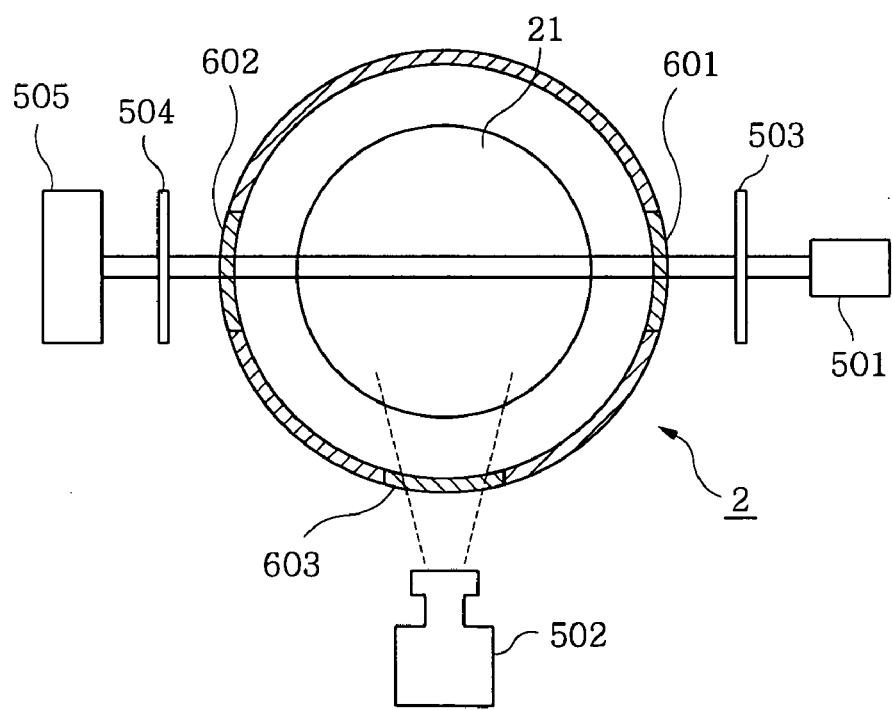
Figure 19:
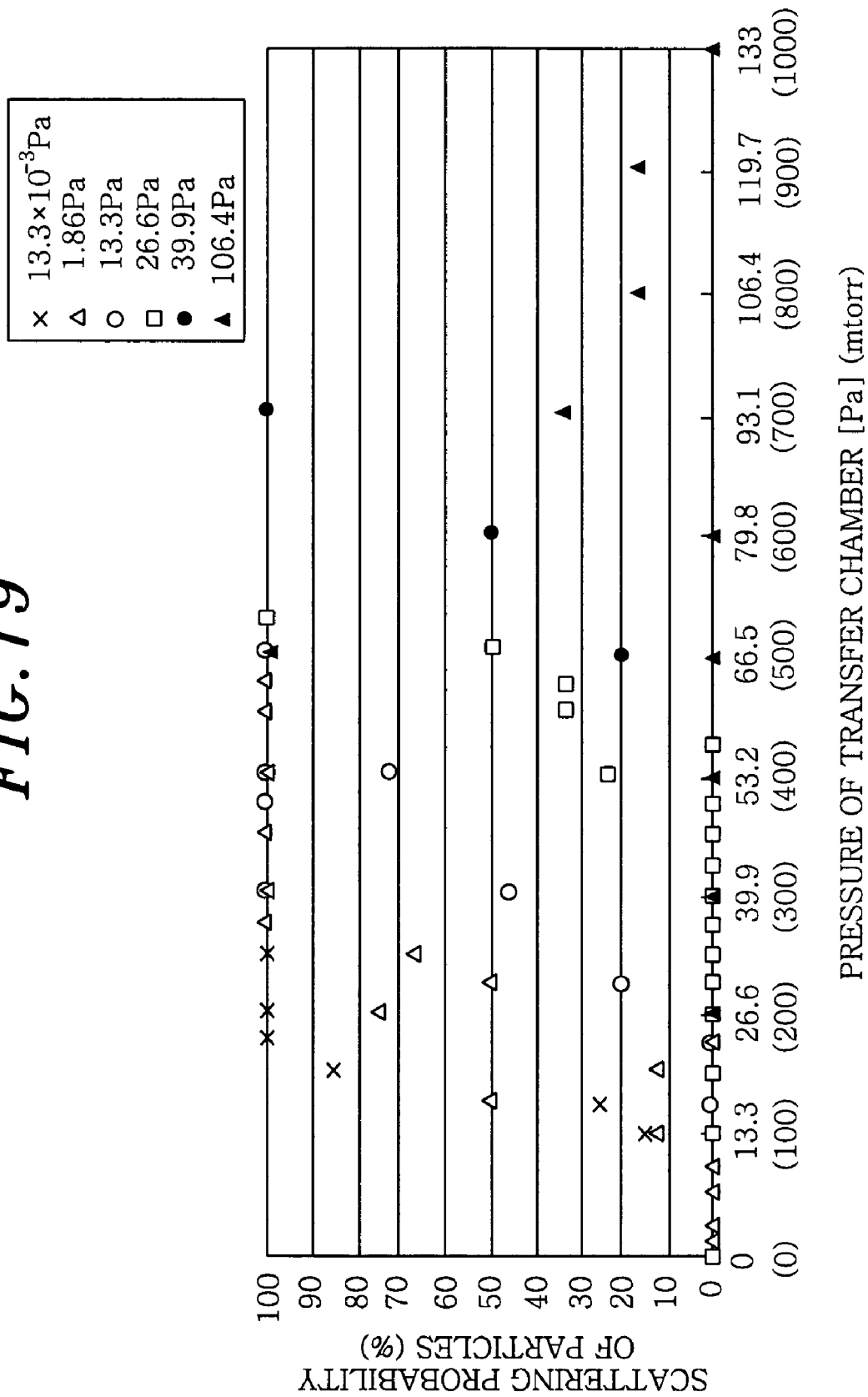
FIG. 19 is a graph showing a relation between a pressure inside a transfer chamber and a state of particle generation.

Meanwhile, in the present invention, a practical substrate processing apparatus may be formed as described in FIGS. 18A and 18B, for example. In other words, particle detection means is provided in the vacuum chamber by CCD camera or the like, and it may observed whether the particles are generated or not in the vacuum chamber, e.g., substrate processing chamber, by opening and closing the gate valve G. As the opening and closing timing for detecting the particles, it may be performed when the wafer exists in the vacuum chamber, or the wafer is not loaded in the vacuum chamber due to a change of lot.

Further, the detection result of the particle is reflected, i.e., inputted to the control unit 80. In case where the particles are not detected, the pressure controlling mode shown in FIGS. 16 and 17 is invalid. On the other hand, in case where the particles are detected, the setting value is changed so that the pressure difference becomes small in the flow of FIG. 16 or the setting value is changed so that both pressures are small in the flow of FIG. 17, and the alarm may be given.

While the invention has been shown and described with respect to the preferred embodiment, it will be understood by those skilled in the art that various changes and modifications may be made without departing from the spirit and scope of the invention as defined in the following claims.

What is recited is:

1. A substrate processing apparatus, wherein a first vacuum chamber is connected to a second vacuum chamber through a transferring port, which is opened and closed by a gate valve, and a wafer is transferred between the first and the second vacuum chamber by a substrate transfer device through the transferring port, and a vacuum process is performed on substrates, the apparatus comprising:
   a first pressure detection unit for detecting an inner pressure of the first vacuum chamber;
   a second pressure detection unit for detecting an inner pressure of the second vacuum chamber;
   a purge gas supply unit for pressure control, which supplies a purge gas for pressure control into one of the first and the second vacuum chamber; and
   a control unit for outputting a control signal to open the gate valve under a condition that both pressure detection values of the first and the second pressure detection unit are less than 66.5 Pa and a higher one of the pressure detection values is less than twice a lower one of the pressure detection values.

2. The substrate processing apparatus as recited in claim 1, further comprising a purge gas supply unit for peeling of particles, which supplies, before supplying the purge gas for pressure control, a purge gas for peeling of particles into said one of the vacuum chambers with a viscous force larger than that exerted when supplying the purge gas for pressure control.

3. The substrate processing apparatus as recited in claim 2, wherein the molecular weight of the purge gas for peeling of particles is larger than that of the purge gas for pressure control.

4. The substrate processing apparatus as recited in claim 2, wherein said one of the vacuum chambers into which the purge gas is supplied constitutes a substrate processing chamber for performing the vacuum process on the substrate, and wherein a flow rate of the purge gas for peeling of particles is set to exert a viscous force, which is greater than that exerted when supplying the purge gas for pressure control when being supplied and that of a gas to be supplied into the substrate processing chamber while the substrate is loaded therein.

5. A substrate processing apparatus, wherein a first vacuum chamber is connected to a second vacuum chamber through a transferring port, which is opened and closed by a gate valve, and a wafer is transferred between the first and the second vacuum chamber by a substrate transfer device through the transferring port, and a vacuum process is performed on substrates, the apparatus comprising:

a first pressure detection unit for detecting an inner pressure of the first vacuum chamber;

a second pressure detection unit for detecting an inner pressure of the second vacuum chamber; and a control unit for outputting a control signal to open the gate valve under a condition that both pressure detection values of the first and the second pressure detection unit are less than 13.3 Pa.

6. The apparatus as recited in claim 5, wherein one of the first and the second vacuum chamber constitutes a substrate processing chamber for performing the vacuum process on the substrate, the apparatus further comprising a purge gas supply unit for supplying a purge gas for peeling of particles into the substrate processing chamber before opening the gate valve, and wherein a flow rate of the purge gas for peeling of particles is set to exert a viscous force greater than that of a purge gas for pressure control when being supplied and that of a gas to be supplied into the substrate processing chamber while the substrate is loaded therein.

7. A substrate transferring method for use in a substrate processing apparatus wherein a substrate is transferred between a first and a second vacuum chamber by a substrate transfer device through a transferring port, the second vacuum chamber being connected to the first vacuum chamber through the transferring port which is opened and closed by a gate valve, the method comprising the steps of:

supplying a purge gas for pressure control to one of the first and the second vacuum chamber; and then opening the gate valve under a condition that both pressure detection values of the first and the second vacuum chamber are less than 66.5 Pa and a higher one of the pressure detection values is less than twice a lower one of the pressure detection values.

8. The substrate transferring method as recited in claim 7, further comprising the step of supplying, before supplying the purge gas for pressure control, a purge gas for peeling of particles into said one of the vacuum chambers with a viscous force greater than that exerted when supplying the purge gas for pressure control.

9. The substrate transferring method as recited in claim 7, wherein the molecular weight of the purge gas for peeling of particles is larger than that of the purge gas for pressure control.

10. A substrate transferring method for use in a substrate processing apparatus wherein a substrate is transferred between a first and a second vacuum chamber by a substrate transfer device through a transferring port, the second vacuum chamber being connected to the first vacuum chamber through the transferring port which is opened and closed by a gate valve, the method comprising the step of:

opening the gate valve under a condition that both pressure detection values of the first and the second vacuum chamber are less than 13.3 Pa, wherein one of the first and the second vacuum chamber constitutes the substrate processing chamber for performing a vacuum process on the substrate, and the method further comprising the step of supplying a purge gas for peeling of particles into the substrate processing chamber before opening the gate valve, and wherein a flow rate of the purge gas for peeling of particles is set to exert a viscous force greater than that of a gas to be supplied into the substrate processing chamber while the substrate is loaded therein.

* * * * *